(12) United States Patent
Tsai et al.

(10) Patent No.: US 9,349,831 B2
(45) Date of Patent: *May 24, 2016

(54) INTEGRATED CIRCUIT DEVICE WITH WELL CONTROLLED SURFACE PROXIMITY AND METHOD OF MANUFACTURING SAME

(71) Applicant: Taiwan Semiconductor Manufacturing Company, Ltd., Hsin-Chu (TW)

(72) Inventors: Ming-Huan Tsai, Hsinchu County (TW); Chun-Fai Cheng, Tin Shui Wai (HK); Hui Ouyang, Hsinchu County (TW); Yuan-Hung Chiu, Taipei (TW); Yen-Ming Chen, Hsin-Chu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/138,573

(22) Filed: Dec. 23, 2013

(65) Prior Publication Data

US 2014/0106522 A1 Apr. 17, 2014

Related U.S. Application Data

(63) Continuation of application No. 13/961,748, filed on Aug. 7, 2013, now Pat. No. 8,900,960, which is a continuation of application No. 13/240,025, filed on Sep. 22, 2011, now Pat. No. 8,614,132, which is a continuation of application No. 12/816,519, filed on Jun. 16, 2010, now Pat. No. 8,236,659.

(51) Int. Cl.
*H01L 29/66* (2006.01)
*H01L 21/265* (2006.01)
(Continued)

(52) U.S. Cl.
CPC ........ *H01L 29/66515* (2013.01); *H01L 21/265* (2013.01); *H01L 21/26586* (2013.01);
(Continued)

(58) Field of Classification Search
CPC .............. H01L 29/66515; H01L 2/265; H01L 21/823814; H01L 29/66636; H01L 21/26586; H01L 29/7848
See application file for complete search history.

(56) References Cited

U.S. PATENT DOCUMENTS

| | | |
|---|---|---|
| 5,413,945 A | 5/1995 | Chien et al. |
| 5,650,340 A | 7/1997 | Burr et al. |

(Continued)

FOREIGN PATENT DOCUMENTS

| | | |
|---|---|---|
| JP | 03033201 | 2/1991 |
| JP | 2006141642 | 6/2006 |

OTHER PUBLICATIONS

Flamm, Daniel L., "Mechanisms of Silicon Etching in Fluorine-and-Chlorine-Containing Plasmas," Pure & Appl. Chem., vol. 62, No. 9, pp. 1709-1720, 1990.

(Continued)

*Primary Examiner* — William Coleman
(74) *Attorney, Agent, or Firm* — Haynes and Boone, LLP

(57) ABSTRACT

An integrated circuit device and method for manufacturing the integrated circuit device is disclosed. The disclosed method provides improved control over a surface proximity and tip depth of integrated circuit device. In an embodiment, the method achieves improved control by forming a doped region and a lightly doped source and drain (LDD) region in a source and drain region of the device. The doped region is implanted with a dopant type opposite the LDD region.

20 Claims, 23 Drawing Sheets

(51) Int. Cl.
*H01L 21/8238* (2006.01)
*H01L 29/78* (2006.01)

(52) U.S. Cl.
CPC ...... *H01L21/823807* (2013.01); *H01L 21/823814* (2013.01); *H01L 29/66636* (2013.01); *H01L 29/7848* (2013.01); H01L 29/6656 (2013.01); H01L 29/66628 (2013.01)

(56) References Cited

U.S. PATENT DOCUMENTS

| | | | |
|---|---|---|---|
| 6,133,082 | A | 10/2000 | Masuoka |
| 6,199,082 | B1 | 3/2001 | Ferrel et al. |
| 6,579,770 | B2 | 6/2003 | Rodder et al. |
| 6,585,841 | B1 | 7/2003 | Popp et al. |
| 7,078,285 | B1 | 7/2006 | Suenaga |
| 7,148,097 | B2 | 12/2006 | Yu et al. |
| 7,195,985 | B2 | 3/2007 | Murthy et al. |
| 7,494,858 | B2 | 2/2009 | Bohr et al. |
| 7,851,313 | B1 * | 12/2010 | Luo et al. .............. 438/285 |
| 7,989,299 | B2 | 8/2011 | Fukutome et al. |
| 8,062,454 | B2 | 11/2011 | Yamamoto et al. |
| 8,216,906 | B2 | 7/2012 | Tsai et al. |
| 8,236,659 | B2 | 8/2012 | Tsai et al. |
| 8,501,570 | B2 | 8/2013 | Fang et al. |
| 8,614,132 | B2 * | 12/2013 | Tsai et al. .............. 438/300 |
| 2011/0147810 | A1 * | 6/2011 | Hsu et al. .............. 257/288 |
| 2012/0083088 | A1 | 4/2012 | Tsai et al. |
| 2012/0108026 | A1 | 5/2012 | Nieh et al. |
| 2013/0017660 | A1 | 1/2013 | Fang et al. |
| 2013/0323891 | A1 | 12/2013 | Tsai et al. |

OTHER PUBLICATIONS

Li, Y.X., et al., Daniel L., "Fabrication of a Single Crystalline Silicon Capacitive lateral Accerlerometer Using Micromachining based on Single Step Plasma Etching," 0-7803-2503-6, 1995, IEEEE, pp. 398-403.

Kovacs, Gregory T. A., et al., "Bulk Micromachining of Silicon," Proceedings of the IEEE, vol. 86, No. 8, Aug. 1998, pp. 1536-1551.

* cited by examiner

INTEGRATED CIRCUIT DEVICE WITH WELL CONTROLLED SURFACE PROXIMITY AND METHOD OF MANUFACTURING SAME

PRIORITY DATA

The present application is a continuation application of U.S. patent application Ser. No. 13/961,748, filed Aug. 7, 2013, which is a continuation application of U.S. patent application Ser. No. 13/240,025, filed Sep. 22, 2011, which is a continuation application of U.S. patent application Ser. No. 12/816,519, filed Jun. 16, 2010, now U.S. Pat. No. 8,236,659 issued on Aug. 7, 2012, each of which is hereby incorporated by reference in its entirety.

TECHNICAL FIELD

The present disclosure relates to integrated circuit devices and methods for manufacturing integrated circuit devices.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as semiconductor devices, such as a metal-oxide-semiconductor field-effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often implements epitaxially grown silicon (Si) to form raised source and drain features for an n-type device, and epitaxially grown silicon germanium (SiGe) to form raised source and drain features for a p-type device. Various techniques directed at shapes, configurations, and materials of these source and drain features have been implemented to try and further improve transistor device performance. Although existing approaches have been generally adequate for their intended purposes, they have not been entirely satisfactory in all respects.

SUMMARY

The present disclosure provides for many different embodiments. One of the broader forms of an embodiment of the present invention involves a method that includes: providing a semiconductor substrate; forming a gate structure over the substrate; performing a first implantation process with a first dopant on the substrate, thereby forming a lightly doped source and drain (LDD) region in the substrate, the LDD region being interposed by the gate structure; performing a second implantation process with a second dopant on the substrate, the second dopant being opposite the first dopant, thereby forming a doped region in the substrate, the doped region being interposed by the gate structure; forming spacers for the gate structure; and forming source and drain features on each side of the gate structure.

Another one of the broader forms of an embodiment of the present invention involves a method that includes: providing a semiconductor substrate having a first region and a second region; forming first and second gate structures over the substrate in the first and second regions, respectively; forming first and second lightly doped source and drain (LDD) regions in the first and second regions, respectively; forming a dielectric layer over the substrate, including over the second gate structure; forming a doped region in the substrate in the second region at either side of the second gate structure; forming spacers for the first and second gate structures; forming a first recess in the substrate at either side of the first gate structure; epitaxially (epi) growing a first semiconductor material to fill the first recess; forming a second recess in the substrate at either side of the second gate structure; and epitaxially (epi) growing a second semiconductor material to fill the second recess, the second semiconductor material being different than the first semiconductor material.

According to another of the broader forms of the invention, a method includes: providing a semiconductor substrate having a first region and a second region; forming first and second gate structures over the substrate in the first and second regions, respectively; forming first and second lightly doped source and drain (LDD) regions in the first and second regions, respectively; forming offset spacers on sidewalls of the first and second gate structures; forming a doped region in the substrate in the second region at either side of the second gate structure; forming a first recess in the substrate at either side of the first gate structure; epitaxially (epi) growing a first semiconductor material to fill the first recess; forming main spacers for the first and second gate structures; forming a second recess in the substrate at either side of the second gate structure; and epitaxially (epi) growing a second semiconductor material to fill the second recess, the second semiconductor material being different than the first semiconductor material.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
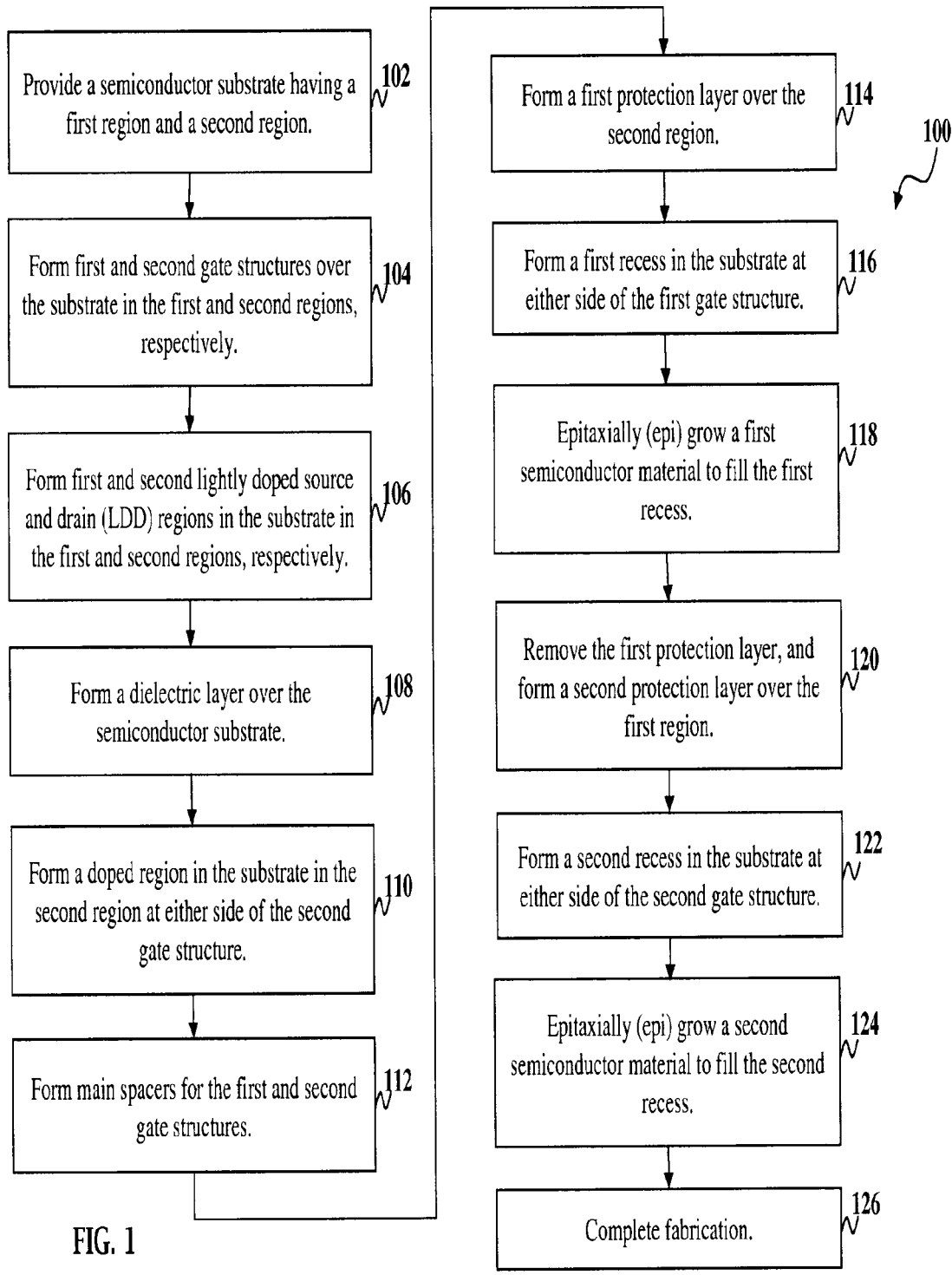
FIG. 1 is a flow chart of a method for fabricating an integrated circuit device according to an embodiment of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of an embodiment of a method 100 for fabricating an integrated circuit device according to various aspects of the present disclosure. The method 100 begins at block 102 where a semiconductor substrate having first and second regions is provided. At block 104, first and second gate structures are formed over the substrate in the first and second regions, respectively. At block 106, first and second lightly doped source and drain (LDD) regions are formed in the substrate in the first and second regions, respectively. The method continues with block 108 where a dielectric layer is formed over the semiconductor substrate. At block 110, a doped region is formed in the substrate in the second region at either side of the second gate structure. The doped region includes a dopant of a type opposite a dopant used to form the second LDD region. The method 100 at block 112 includes forming main spacers for the first and second gate structures.

At blocks 114 and 116, a first protection layer is formed over the second region, and a first recess is formed in the substrate at either side of the first gate structure in the first region. The method continues at block 118 where a first semiconductor material is epitaxially grown to fill the first recess, thereby forming source and drain features in the first region. At blocks 120 and 122, the first protection layer is removed from the second region, a second protection layer is formed over the first region, and a second recess is formed in the substrate at either side of the second gate structure. At block 124, a second semiconductor material is epitaxially grown to fill the second recess, thereby forming source and drain features for the second region. The method 100 continues with block 126 where fabrication of the integrated circuit device is completed. Additional steps can be provided before, during, and after the method 100, and some of the steps described can be replaced or eliminated for additional embodiments of the method. The discussion that follows illustrates various embodiments of an integrated circuit device that can be fabricated according to the method 100 of FIG. 1.

FIGS. 2-10 are various diagrammatic cross-sectional views of an embodiment of an integrated circuit device 200 during various fabrication stages according to the method 100 of FIG. 1. FIGS. 2-10 have been simplified for the sake of clarity to better understand the inventive concepts of the present disclosure. In the depicted embodiment, as will be further discussed below, the integrated circuit device 200 includes field effect transistor devices, specifically an n-channel field effect transistor (NFET) and a p-channel field effect transistor (PFET). The integrated circuit device 200 can further include memory cells and/or logic circuits, passive components such as resistors, capacitors, inductors, and/or fuses; and active components, such as metal-oxide-semiconductor field effect transistors (MOSFETs), complementary metal-oxide-semiconductor transistors (CMOSs), high voltage transistors, and/or high frequency transistors; other suitable components; or combinations thereof. Additional features can be added in the integrated circuit device 200, and some of the features described below can be replaced or eliminated for additional embodiments of the integrated circuit device 200.

Figure 2:
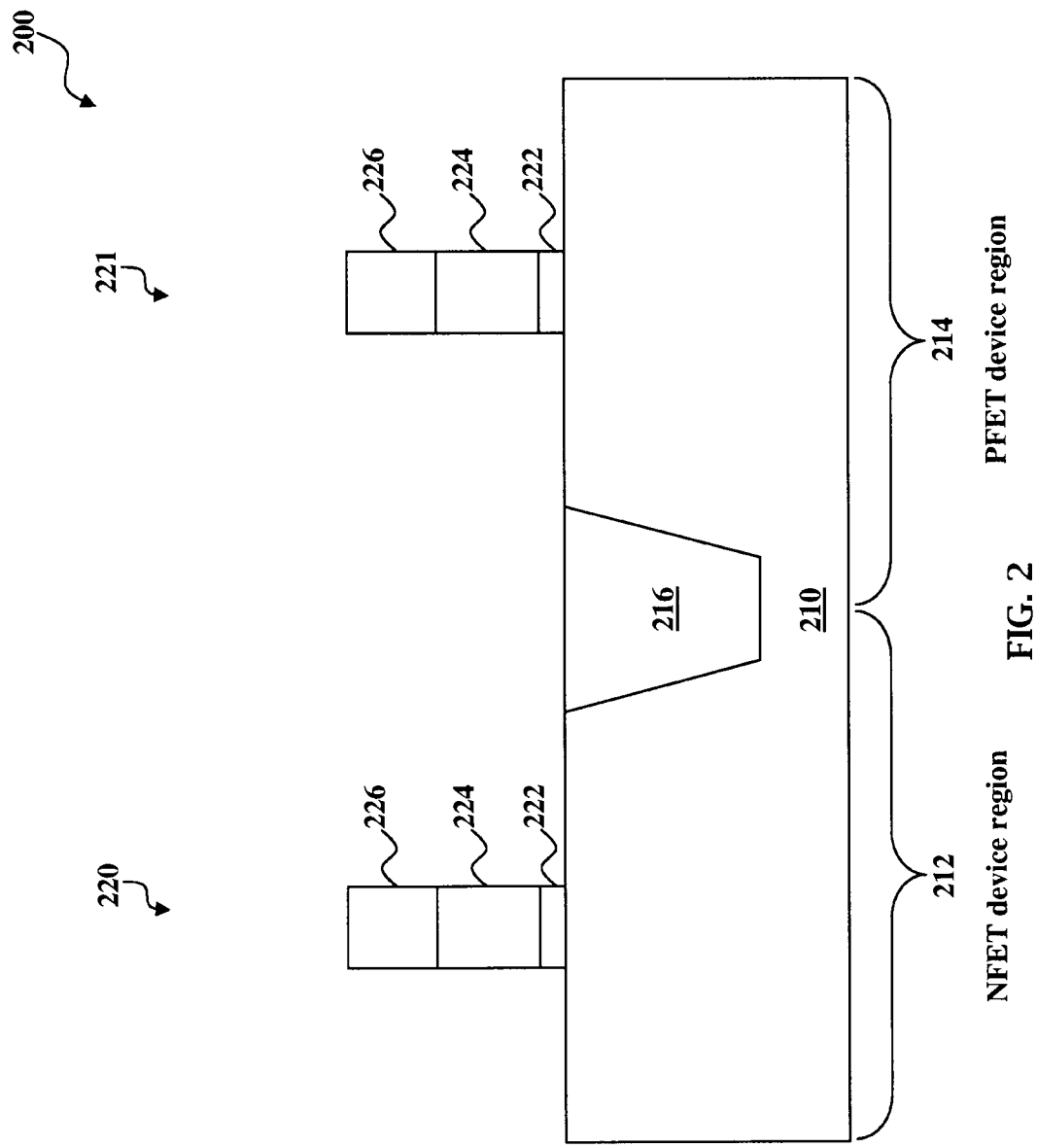
FIGS. 2-10 are various diagrammatic cross-sectional views of an embodiment of an integrated circuit device during various fabrication stages according to the method of FIG. 1.

In FIG. 2, a substrate 210 is provided. In the depicted embodiment, the substrate 210 is a semiconductor substrate including silicon. The substrate may be a p-type or n-type substrate. Alternatively, the substrate 210 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In other alternatives, semiconductor substrate 210 may include a doped epi layer, a gradient semiconductor layer, and/or a semiconductor layer overlying another semiconductor layer of a different type, such as a silicon layer on a silicon germanium layer.

The substrate 210 may include various doped regions depending on design requirements as known in the art (e.g., p-type wells or n-type wells). The doped regions may be doped with p-type dopants, such as boron or $BF_2$; n-type dopants, such as phosphorus or arsenic; or a combination thereof. The doped regions may be formed directly on the substrate 210, in a P-well structure, in a N-well structure, in a dual-well structure, or using a raised structure. The integrated circuit device 200 includes a device region 212 and another device region 214 of the substrate 210, and thus, the substrate 210 may include various doped regions configured for a particular device in each region 212 and 214. In the depicted embodiment, the NFET will be formed in the device region 212, which is referred to as an NFET device region, and the PFET device will be formed in the device region 214, which is referred to as a PFET device region. Accordingly, the device region 212 may include a doped region configured for an NFET device, and the device region 214 may include a doped region configured for a PFET device.

Isolation feature 216 is formed in the substrate 210 to isolate various regions of the substrate 210, such as device regions 212 and 214. The isolation feature 216 also isolates the device regions 212 and 214 from other devices (not shown). The isolation feature 216 utilizes isolation technology, such as local oxidation of silicon (LOCOS) and/or shallow trench isolation (STI), to define and electrically isolate the various regions. The isolation feature 216 comprises silicon oxide, silicon nitride, silicon oxynitride, other suitable materials, or combinations thereof. The isolation feature 216 is formed by any suitable process. As one example, forming an STI includes a photolithography process, etching a trench in the substrate (for example, by using a dry etching and/or wet etching), and filling the trench (for example, by using a chemical vapor deposition process) with one or more dielectric materials. For example, the filled trench may have a multi-layer structure, such as a thermal oxide liner layer filled with silicon nitride or silicon oxide. In another example, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

The integrated circuit device 200 includes a gate structure 220 for the NFET device and a gate structure 221 for the PFET device. The gate structure 220 is disposed over the substrate 210 in NFET device region 212, and the gate structure 221 is disposed over the substrate 210 in PFET device region 214. In the depicted embodiment, the gate structures 220 and 221 include a gate dielectric layer 222, a gate layer 224 (referred to as a gate electrode), and a hard mask layer 226. The gate dielectric layer 222, gate layer 224, and hard mask layer 226 form gate stacks for the gate structures 220 and 221. The gate stacks 220 and 221 may include additional layers as is known in the art. The gate structures 220 and 221 are formed by deposition, lithography patterning, etching processes, or combination thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable deposition methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the photolithography exposing process is implemented or replaced by other proper methods, such as maskless photolithography, electron-beam writing, or ion-beam writing. The etching processes include dry etching, wet etching, other etching methods, or combinations thereof. The gate structures 220 and 221 may be formed simultaneously, utilizing the same processing steps and processing materials; independently of one another, utilizing varying processing steps and processing materials; or using a combination of simultaneous and independent processing steps and processing materials.

The gate dielectric layer 222 is formed over the substrate 210 and includes a dielectric material, such as silicon oxide, silicon oxynitride, silicon nitride, a high-k dielectric material, other suitable dielectric material, or combinations thereof. Exemplary high-k dielectric materials include $HfO_2$, HfSiO, HfSiON, HfTaO, HfTiO, HfZrO, other suitable materials, or combinations thereof. The gate dielectric layer 222 may include a multilayer structure. For example, the gate dielectric layer 222 may include an interfacial layer, and a high-k dielectric material layer formed on the interfacial layer. An exemplary interfacial layer may be a grown silicon oxide layer formed by a thermal process or ALD process.

The gate layer 224 is formed over the gate dielectric layer 222. In the present embodiment, the gate layer 224 is a polycrystalline silicon (polysilicon) layer. The polysilicon layer may be doped for proper conductivity. Alternatively, the polysilicon is not necessarily doped if a dummy gate is to be formed and replaced in a subsequent gate replacement process. Alternatively, the gate layer 224 could include a conductive layer having a proper work function, therefore, the gate layer 224 can also be referred to as a work function layer. The work function layer comprises any suitable material, such that the layer can be tuned to have a proper work function for enhanced performance of the associated device. For example, if a p-type work function metal (p-metal) for the PFET device is desired, TiN or TaN may be used. On the other hand, if an n-type work function metal (n-metal) for the NFET device is desired, Ta, TiAl, TiAlN, or TaCN, may be used. The work function layer may include doped conducting oxide materials. The gate layer 224 may include other conductive materials, such as aluminum, copper, tungsten, metal alloys, metal silicide, other suitable materials, or combinations thereof. For example, where the gate layer 224 includes a work function layer, another conductive layer can be formed over the work function layer.

The hard mask layer 226 is formed over the gate layer 224. The hard mask layer 226 includes silicon oxide, silicon nitride, silicon oxynitride, silicon carbide, other suitable dielectric material, or combinations thereof. The hard mask layer 226 may have a multi-layer structure.

Figure 3:
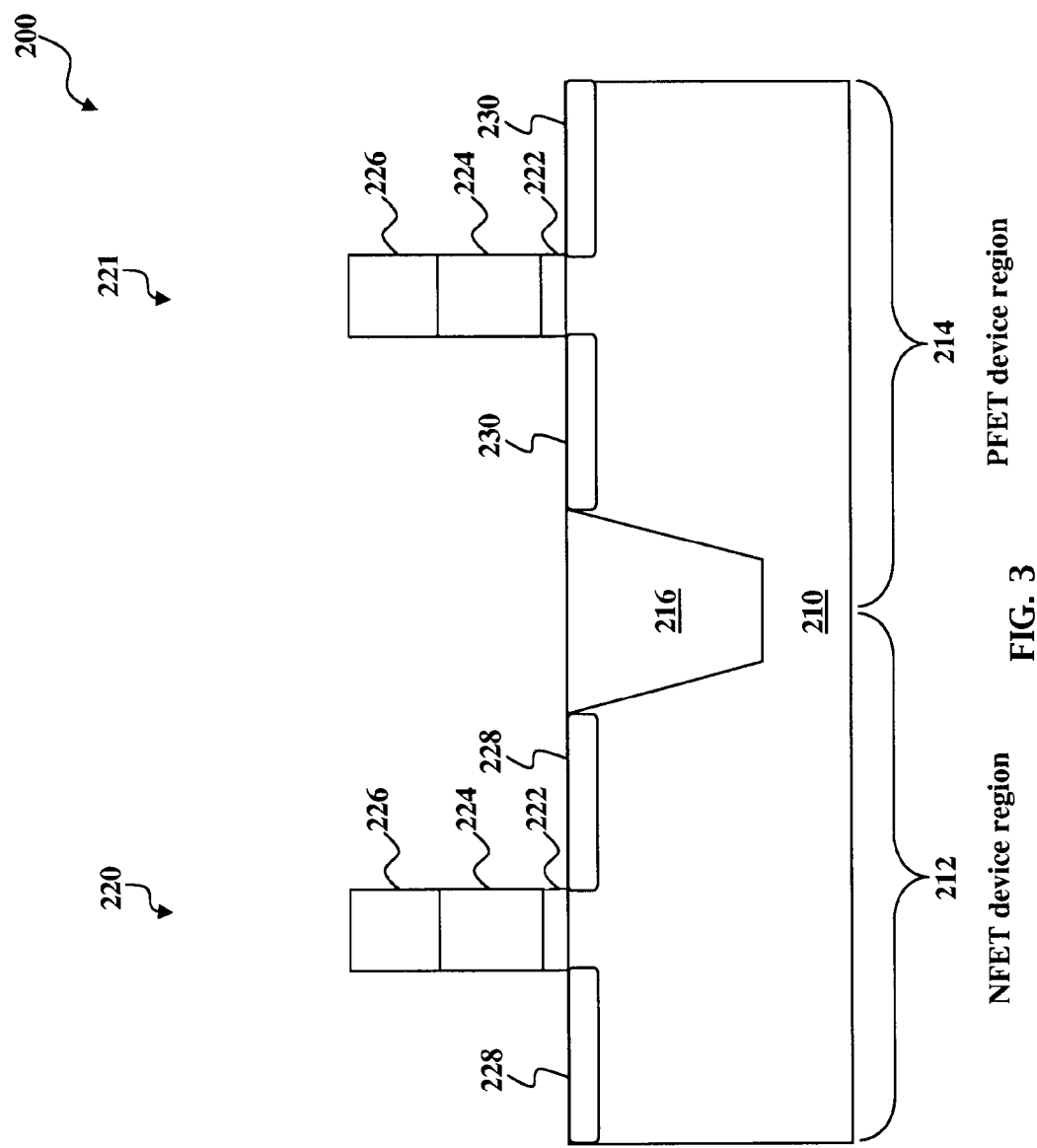

In FIG. 3, lightly doped source/drain (LDD) regions are formed in source and drain regions of the substrate 210 in the device regions 212 and 214. In the depicted embodiment, LDD regions 228 are formed in the substrate 210, interposed by the gate structure 220, in the NFET device region 212; and LDD regions 230 are formed in the substrate 210, interposed by the gate structure 221, in the PFET device region 214. The LDD regions 228 and 230 are aligned with the sidewalls of the gate stacks of the gate structures 220 and 221. The LDD regions 228 and 230 are formed by an ion implantation process, diffusion process, other suitable process, or combination thereof. The PFET device region 214 may be protected during formation of the LDD regions 228 in the NFET device region 212, and the NFET device region 212 may be protected during formation of the LDD regions 230 in the PFET device region 214. For example, a photoresist layer or hard mask layer may be deposited and patterned over the PFET device region 214 during formation of the LDD regions 228 in the NFET device region 212, and a photoresist layer or hard mask layer can be deposited and patterned over the NFET device region 212 during formation of the LDD regions 230 in the PFET device region 214. In the depicted embodiment, the LDD regions 228 for the NFET device (NLDD) are doped with an n-type dopant, such as phosphorous or arsenic, and the LDD regions 230 for the PFET device (PLDD) are doped with a p-type dopant, such as boron or $BF_2$.

Figure 4:
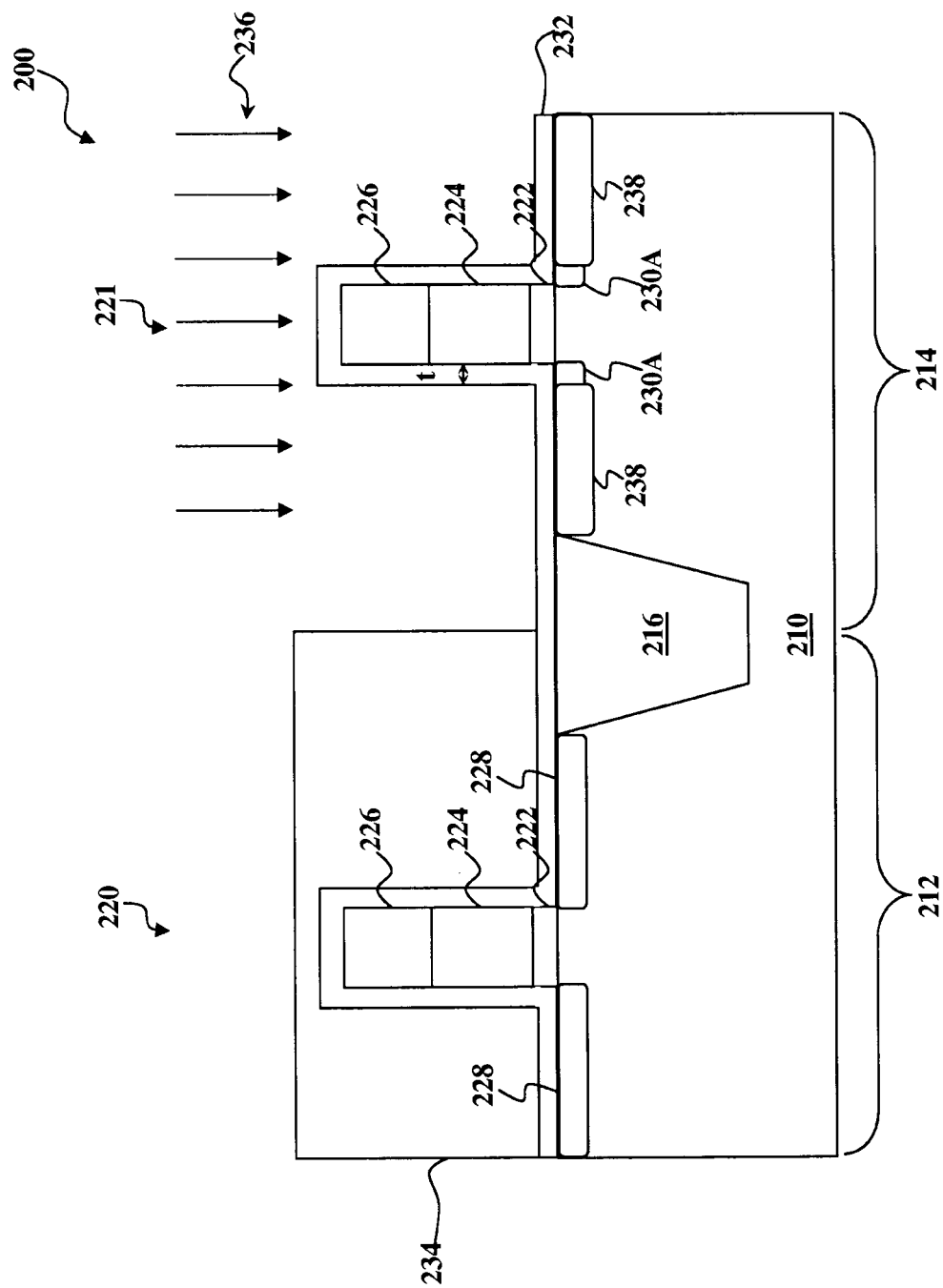

In FIG. 4, a dielectric layer 232 is formed over the substrate 210, and an doped feature is formed in the substrate 210 in the PFET device region 214. In the depicted embodiment, the dielectric layer 232 comprises an oxide material, such as silicon oxide or silicon oxynitride. Alternatively, the dielectric layer 232 comprises silicon nitride. A resist layer (or hard mask layer) 234 is deposited and patterned over the NFET device region 212, and an implantation process 236 is performed on the PFET device region 214 to form doped regions 238 in the substrate 210 in the PFET device region 214. The implantation process 236 utilizes a dopant type opposite the dopant type of the LDD regions 230. In the depicted embodiment, since the LDD regions 230 are doped with a p-type dopant, the doped regions 238 are doped with an n-type dopant, such as phosphorous or arsenic. The dielectric layer 232 acts as a mask during the implantation process 236, such that the doped regions 238 in the substrate 210 are interposed by the gate structure 221, similar to the LDD regions 230, yet the doped regions 238 are spaced a distance away from the gate structure 221. In particular, the doped regions 238 are spaced away from the gate structure 221 by a distance equal to the thickness (t) of the dielectric layer 232 disposed on the sidewalls of the gate structure 221. After the implantation process 236, an LDD region 230A remains in the substrate 210 in the PFET device region 214. As further discussed below, since the doped regions 238 have a different doping species than the remaining LDD regions 230A, the etching rate of the substrate 210 including the doped regions 238 is greater than the substrate 210 including the LDD regions 230A. Thereafter, the patterned resist layer 234 is removed by a photoresist stripping process, for example.

Figure 5:
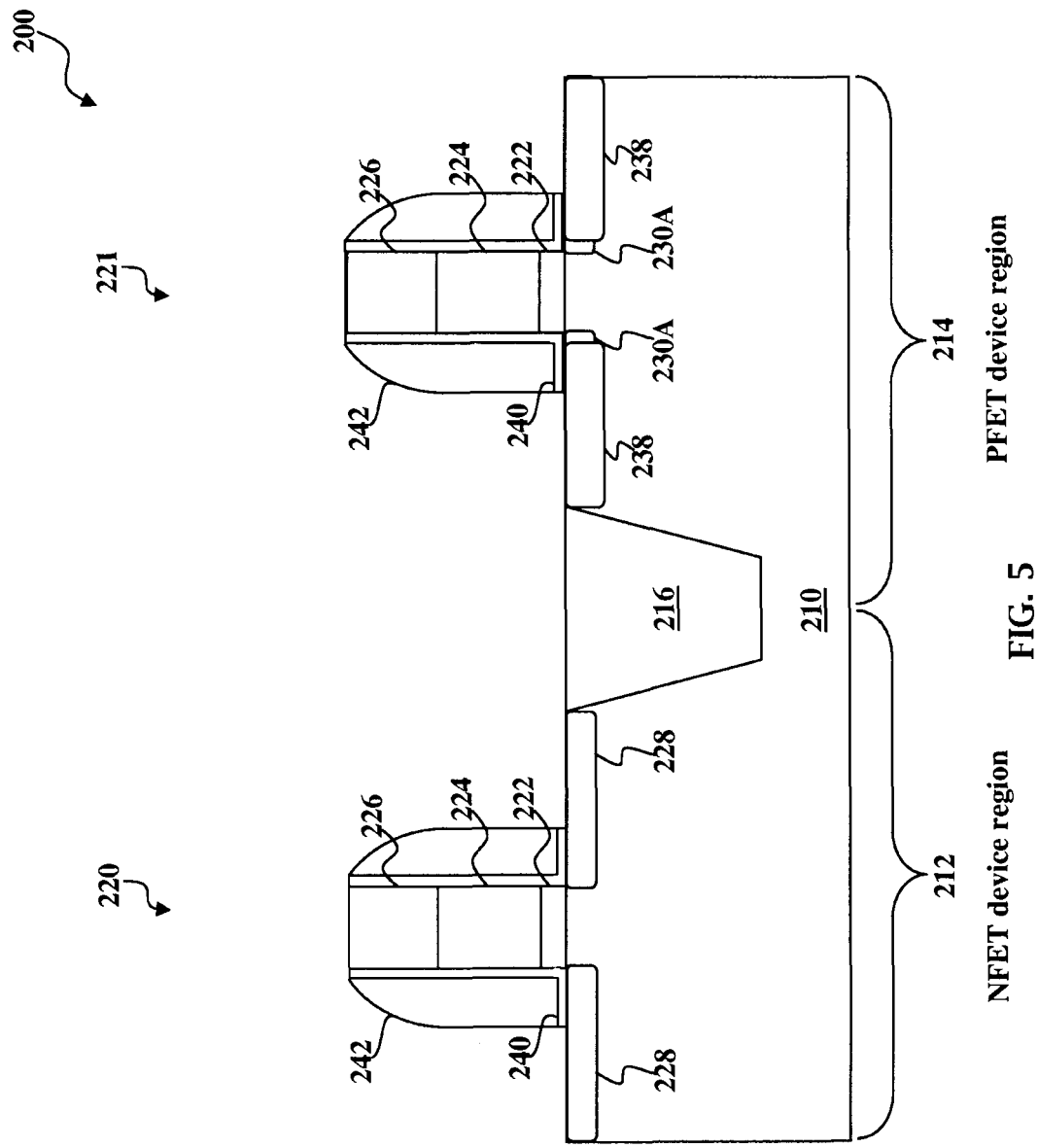

In FIG. 5, spacers are formed for gate structures 220 and 221. In the depicted embodiment, spacer liner 240 and spacers 242 are formed by a suitable process. For example, a dielectric layer, such as a silicon nitride layer, is blanket deposited over the integrated circuit device 200, including over the dielectric layer 232; and then, the silicon nitride layer and dielectric layer 232 are anisotropically etched to remove the dielectric layer 232 to form spacer liner 240 and the silicon nitride layer to form spacers 242 as illustrated in FIG. 5. The spacer liner 240 and spacers 242 are positioned adjacent the sidewalls of the gate stacks (gate dielectric layer 222, gate layer 224, and hard mask layer 226) of the gate structures 220 and 221. Alternatively, the spacers 242 include another dielectric material, such as silicon oxide, silicon oxynitride, or combinations thereof. The spacer liner 240 may also comprise another suitable dielectric material.

Figure 6:
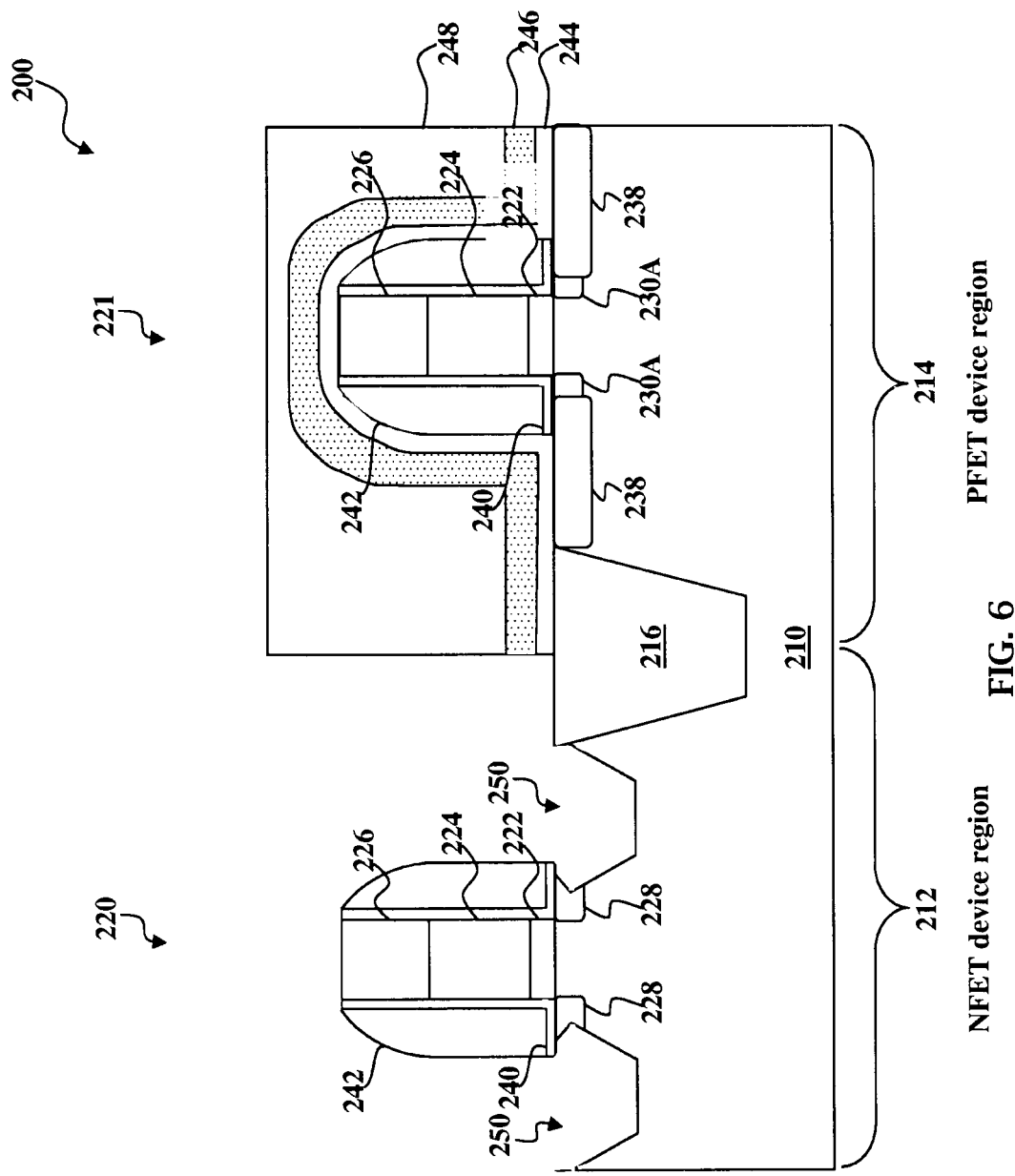
Figure 7:
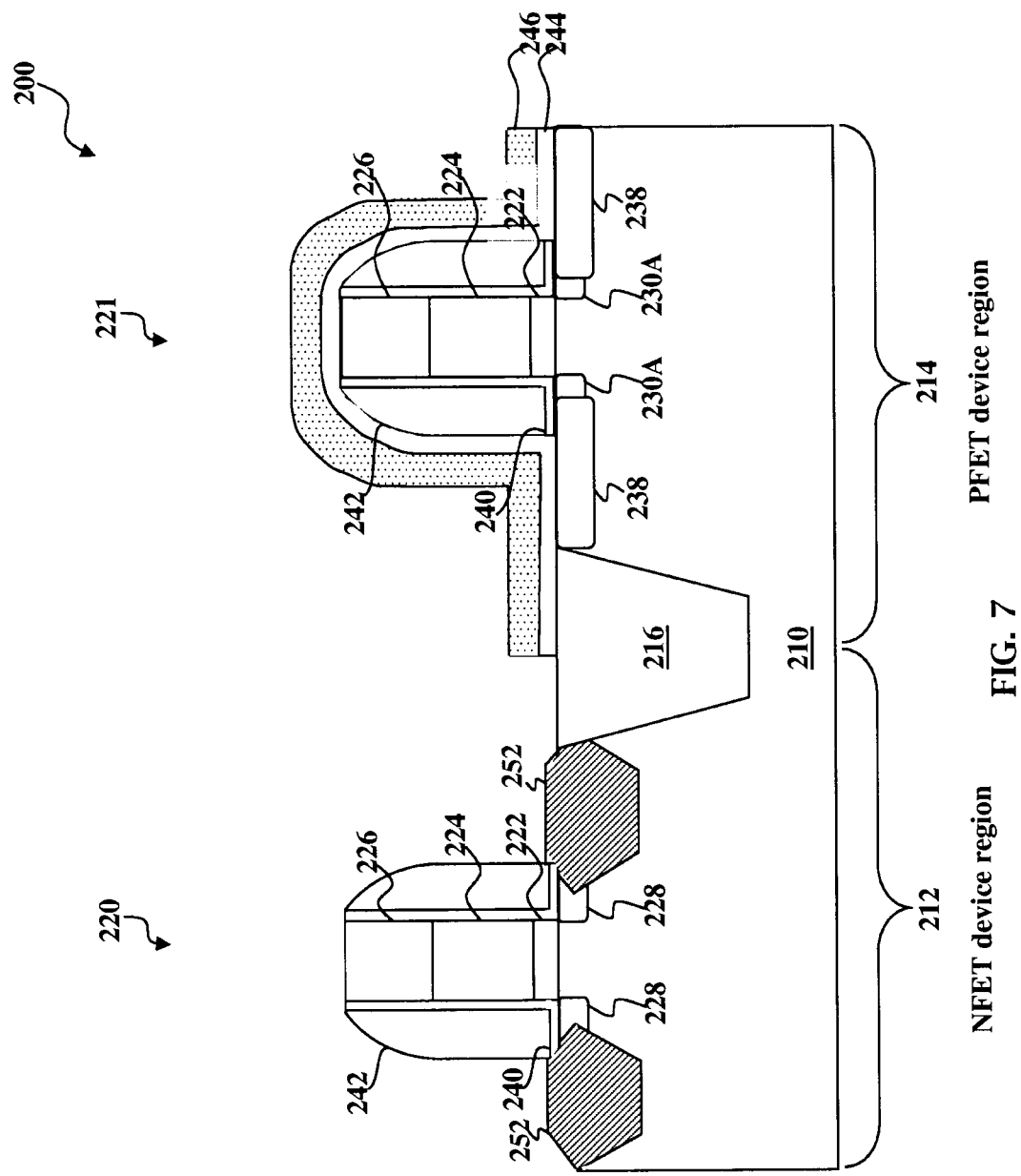

In FIGS. 6-10, source/drain engineering is performed to configure the source/drain region of the NFET device region 212 for an NFET device and to configure the source/drain region of the PFET device region 214 for a PFET device. In FIGS. 6 and 7, source/drain (S/D) features are formed in the NFET device region 212. For example, in FIG. 6, portions of the substrate 210 are removed at either side of the gate structure 220 in the NFET device region 212, particularly in the source and drain region of the NFET device. In the depicted embodiment, a capping layer 244, another capping layer 246, and a photoresist layer 248 are formed over the integrated circuit device 200 and patterned to protect the PFET device during processing of the NFET device region 212. The capping layer 244 may comprise an oxide material, and capping layer 246 may comprise a nitride material. The capping layers 244 and 246 may comprise other suitable materials as known in the art. The photoresist layer 248 may include an antireflective coating layer, such as a bottom antireflective coating (BARC) layer and/or a top antireflective coating (TARC) layer. The patterned layers 244, 246, and 248 may be formed by a photolithography process. An exemplary photolithography process may include processing steps of photoresist coating, soft baking, mask aligning, exposing, post-exposure baking, developing photoresist, and hard baking. The photolithography process may also be implemented or replaced by other proper techniques, such as maskless photolithography, electron-beam writing, ion-beam writing, and molecular imprint.

An etching process then removes portions of the substrate 210 to form recesses 250 in the substrate 210. The recesses 250 are formed in the source and drain regions of the NFET device in the NFET device region 212. The etching process includes a dry etching process, wet etching process, or combination thereof. In the depicted embodiment, the etching process utilizes a combination dry and wet etching. The dry and wet etching processes have etching parameters that can be tuned, such as etchants used, etching temperature, etching solution concentration, etching pressure, source power, RF bias voltage, RF bias power, etchant flow rate, and other suitable parameters. For example, the dry etching process may utilize an etching pressure of about 1 mT to about 200 mT, a source power of about 200 W to about 2000 W, an RF bias voltage of about 0 V to about 100 V, and an etchant that includes $NF_3$, $Cl_2$, $SF_6$, He, Ar, $CF_4$, or combinations thereof. In an example, the dry etching process includes an etching pressure of about 1 mT to about 200 mT, a source power of about 200 W to about 2000 W, an RF bias voltage of about 0 V to about 100 V, a $NF_3$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In another example, the etching process includes an etching pressure of about 1 mT to about 200 mT, a source power of about 200 W to about 2000 W, an RF bias voltage of about 0 V to about 100 V, a $SF_6$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In yet another example, the etching process includes an etching pressure of about 1 mT to about 200 mT, a source power of about 200 W to about 2000 W, an RF bias voltage of about 0 V to about 100 V, a $CF_4$ gas flow of about 5 sccm to about 100 sccm, a $Cl_2$ gas flow of about 0 sccm to about 100 sccm, an He gas flow of about 0 sccm to about 500 sccm, and an Ar gas flow of about 0 sccm to about 500 sccm. The wet etching solutions may include $NH_4OH$, HF (hydrofluoric acid), TMAH (tetramethylammonium hydroxide), other suitable wet etching solutions, or combinations thereof. In an example, the wet etching process first implements a 100:1 concentration of an HF solution at room temperature, and then implements a $NH_4OH$ solution at a temperature of about 20° C. to about 60° C. In another example, the wet etching process first implements a 100:1 concentration of an HF solution at room temperature, and then implements a TMAH solution at a temperature of about 20° C. to about 60° C. After the etching process, a pre-cleaning process may be performed to clean the recesses 250 with a hydrofluoric acid (HF) solution or other suitable solution.

In FIG. 7, a semiconductor material is deposited in the recesses 250 to form a strained structure in the NFET device region 212. The semiconductor material forms source and drain features 252 in the recesses 250. The source and drain features 252 may alternatively be referred to as raised source and drain regions. In the depicted embodiment, an epitaxy or epitaxial (epi) process is performed to deposit the semiconductor material in the recesses 250. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combination thereof. The epi process may use gaseous and/or liquid precursors, which may interact with the composition of the substrate 210. In the depicted embodiment, the patterned photoresist layer 248 protecting the PFET device region 214 is removed before the epi process. Further, in the depicted embodiment, the source and drain features 252 include epitaxially grown silicon (epi Si). The Si epi source and drain features 252 of the NFET device associated with the gate structure 220 may be in-situ doped or undoped during the epi process. For example, the Si epi source and drain features 252 may be doped with phosphorous to form Si:P source and drain features. When the source and drain features are undoped, it is understood that they may be doped in a subsequent process. The doping may be achieved by an ion implantation process, plasma immersion ion implantation (PIII) process, gas and/or solid source diffusion process, other suitable process, or combinations thereof. The source and drain features 252 may further be exposed to annealing processes, such as a rapid thermal annealing process. Thereafter, the patterned capping layers 246 and 248 are removed by a suitable process.

Figure 8A:
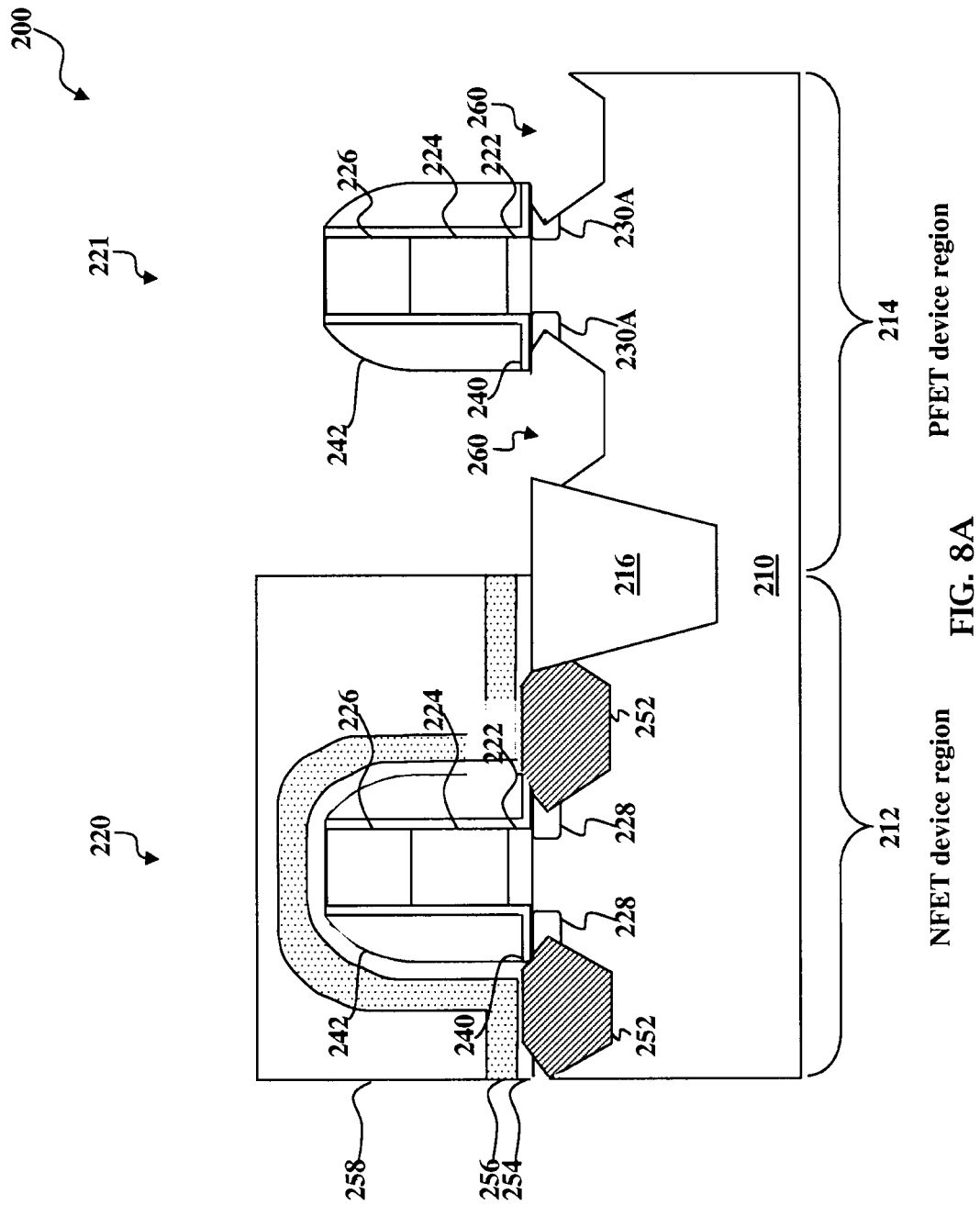
Figure 8B:
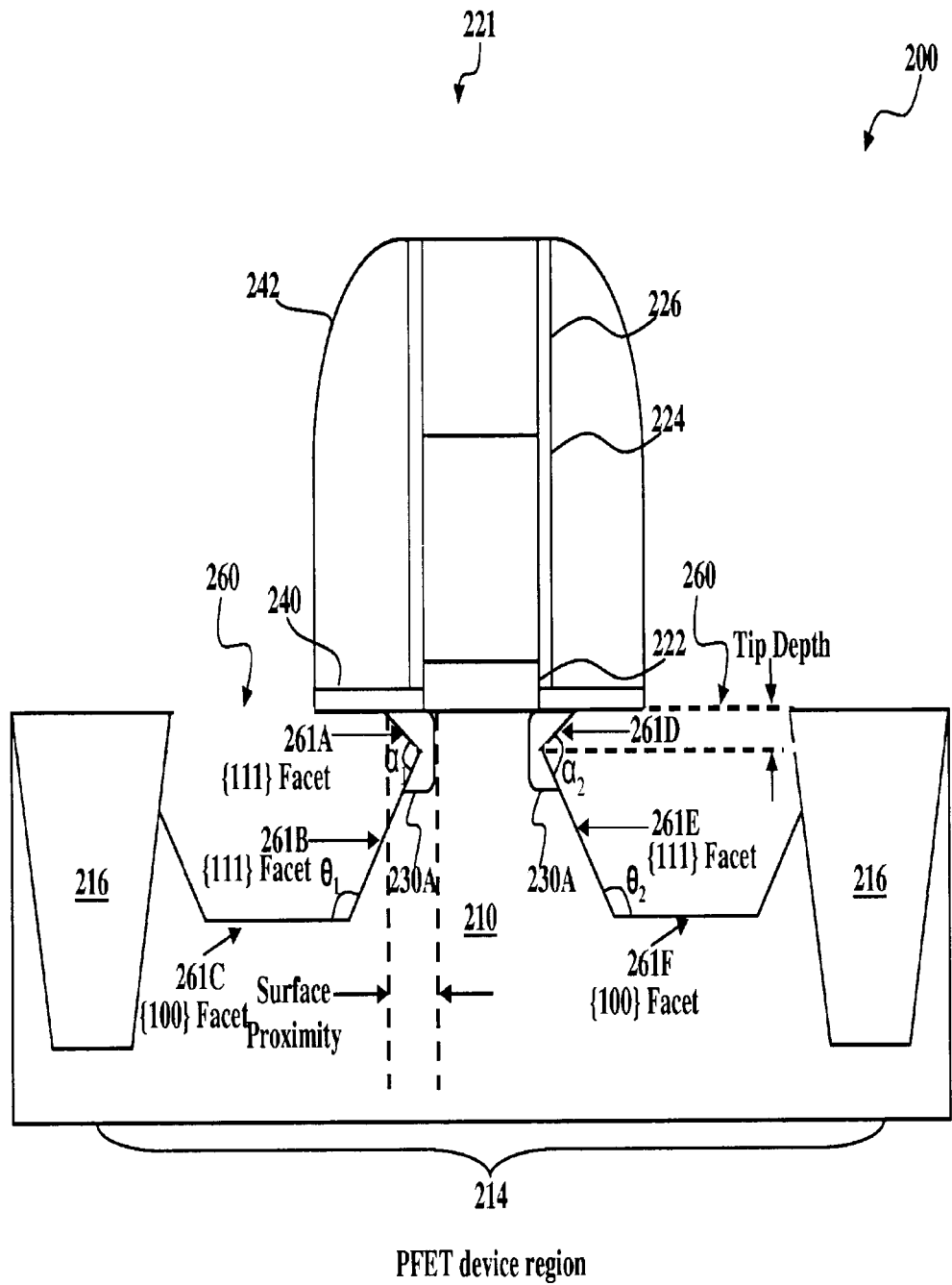
Figure 9:
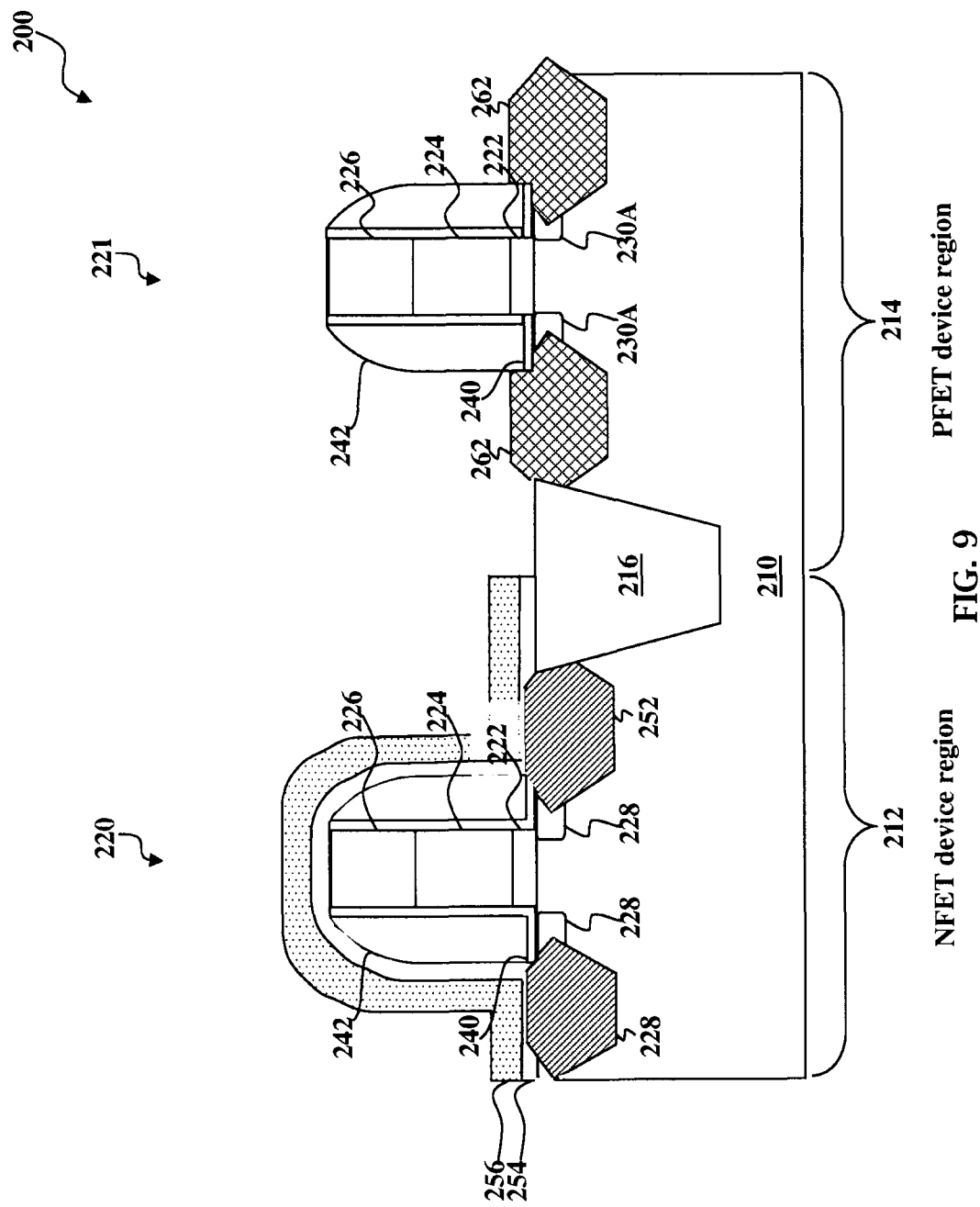

In FIGS. 8A, 8B, and 9, source/drain (S/D) features are formed in the PFET device region 214. For example, in FIG. 8A, portions of the substrate 210 are removed at either side of the gate structure 221 in the PFET device region 214, particularly in the source and drain region of the PFET device. In the depicted embodiment, a capping layer 254, another capping layer 256, and a photoresist layer 258 are formed over the integrated circuit device 200 and patterned to protect the NFET device during processing of the PFET device region 214. The capping layer 254 may comprise an oxide material, and capping layer 256 may comprise a nitride material. The capping layers 254 and 256 may comprise other suitable materials as known in the art. The photoresist layer 258 may include an antireflective coating layer, such as a BARC layer and/or a TARC layer. The patterned layers 254, 256, and 258 may be formed by a photolithography process. An exemplary photolithography process may include processing steps of photoresist coating, soft baking, mask aligning, exposing, post-exposure baking, developing photoresist, and hard baking. The photolithography process may also be implemented or replaced by other proper techniques, such as maskless photolithography, electron-beam writing, ion-beam writing, and molecular imprint.

An etching process then removes portions of the substrate 210 to form recesses 260 in the substrate 210. The recesses 260 are formed in the source and drain regions of the PFET device in the PFET device region 214. The etching process includes a dry etching process, wet etching process, or combination thereof. In the depicted embodiment, the etching process utilizes a combination dry and wet etching. The dry and wet etching processes have etching parameters that can be tuned, such as etchants used, etching temperature, etching solution concentration, etching pressure, source power, RE bias voltage, RF bias power, etchant flow rate, and other suitable parameters. For example, the dry etching process may utilize an etching pressure of about 1 mT to about 200 mT, a source power of about 200 W to about 2000 W, an RF bias voltage of about 0 V to about 100 V, and an etchant that includes $NF_3$, $Cl_2$, $SF_6$, He, Ar, $CF_4$, or combinations thereof. In an example, the dry etching process includes an etching pressure of about 1 mT to about 200 mT, a source power of about 200 W to about 2000 W, an RF bias voltage of about 0 V to about 100 V, a $NF_3$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In another example, the etching process includes an etching pressure of about 1 mT to about 200 mT, a source power of about 200 W to about 2000 W, an RF bias voltage of about 0 V to about 100 V, a $SF_6$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In yet another example, the etching process includes an etching pressure of about 1 mT to about 200 mT, a source power of about 200 W to about 2000 W, an RF bias voltage of about 0 V to about 100 V, a $CF_4$ gas flow of about 5 sccm to about 100 sccm, a $Cl_2$ gas flow of about 0 sccm to about 100 sccm, an He gas flow of about 0 sccm to about 500 sccm, and an Ar gas flow of about 0 sccm to about 500 sccm. The wet etching solutions may include $NH_4OH$, HF (hydrofluoric acid), TMAH (tetramethylammonium hydroxide), other suitable wet etching solutions, or combinations thereof. In an example, the wet etching process first implements a 100:1 concentration of an HF solution at room temperature, and then implements a $NH_4OH$ solution at a temperature of about 20° C. to about 60° C. (for example, to form a {111} facet). In another example, the wet etching process first implements a 100:1 concentration of an HF solution at room temperature, and then implements a TMAH solution at a temperature of about 20° C. to about 60° C. (for example, to form a {111} facet). After the etching process, a pre-cleaning process may be performed to clean the recesses 260 with a hydrofluoric acid (HF) solution or other suitable solution.

The etching profile of the recesses 260 enhances performance of the integrated circuit device 200. In FIG. 8B, the PFET device region 214 of the integrated circuit device 200 is enlarged for better understanding of the etching profile of recesses 260. The etching profile of the recesses 260 defines source and drain regions of the PFET device, and the etching profile of the recesses is defined by facets 261A, 261B, 261C, 261D, 261E, and 261F of the substrate 210. The facets 261A, 261B, 261D, and 261E may be referred to as shallow facets, and the facets 261C and 261F may be referred to as bottom facets. In the depicted embodiment, the etching profile of the recesses 260 is defined by facets 261A, 261B, 261D, and 261E in a {111} crystallographic plane of the substrate 210, and facets 261C and 261F in a {100} crystallographic plane of the substrate 210. An angle $\alpha_1$ between the shallow facets 261A and 261B is from about 45.0° to about 80.0°, and an angle $\theta_1$ between the facets 261B and 261C is from about 50.0° to about 70.0°. An angle $\alpha_2$ between the shallow facets 261C and 261D is from about 45.0° to about 80.0°, and an angle $\theta_2$ between the facets 261E and 261F of the substrate 210 is from about 50.0° to about 70.0°. In the depicted embodiment, $\alpha_1$ and $\alpha_2$ are about 54.7°, and $\theta_1$ and $\theta_2$ are about 54.7°.

The recesses 260 further define a surface proximity and a tip depth (or height). The surface proximity defines a distance that a top surface of the substrate 210 extends from a sidewall of the gate structure (i.e., gate stack including gate dielectric layer 222, gate layer 224, and hard mask layer 226) to the recess 260 (or when the recess is filled, a source and drain feature). In the depicted embodiment, the disclosed etching profile of the recesses 260 achieves a surface proximity of about 1 nm to about 3 nm. The tip depth defines a distance between a top surface of the substrate 210 and an intersection of the facets 261A and 261B (or an intersection of the facets 261D and 261E). In the depicted embodiment, the etching profile of the recesses 260 achieves a tip depth of about 5 nm to about 10 nm.

The etching profile of the recesses 260, which improves device performance, is achieved by the method 100 described herein. Typically, to enhance the performance of integrated circuit device 200, a trade-off occurs. For example, conventional processing reduces the surface proximity to improve saturation current, which often results in a larger tip height, thus leading to increased short channel effects and reduced on/off speed of the integrated circuit device. Accordingly, precise control over the etching profile of the recesses 260 is desired, particularly precise control over the resulting surface proximity and tip shape of the source and drain regions. The disclosed method 100 provides this desired control, resulting in the etching profile of recesses 260 as described with reference to FIGS. 8A and 8B. In particular, referring to FIG. 4 above, doped regions 238 were formed in the source and drain regions of the PFET device, leaving LDD regions 230A. As noted above, additional implantation process implemented to form the doped regions 238 enhances the etching rate of a surface area of the substrate 210 to etching processes used to from the recesses 260. In particular, a difference in etching rate between substrate 210 including the doped regions 238 and the substrate 210 including the LDD regions 230A is increased. The remaining LDD regions 230A can thus act as a dry etch slow down and wet etch stop to the etching processes used to form the recesses 260, allowing the LDD regions 230A to be designed to achieve a desired surface proximity and tip depth.

In FIG. 9, a semiconductor material is deposited in the recesses 260 to form a strained structure in the PFET device region 214. In the depicted embodiment, an epitaxy or epitaxial (epi) process is performed to deposit the semiconductor material in the recesses 260. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combination thereof. The epi process may use gaseous and/or liquid precursors, which may interact with the composition of the substrate 210. The deposited semiconductor material is different from the substrate 210. Accordingly, the channel region of the PFET device is strained or stressed to enhance carrier mobility of the device and enhance device performance. In the depicted embodiment, the patterned photoresist layer 258 protecting the NFET device region 212 is removed before the epi process. Further, in the depicted embodiment, silicon germanium (SiGe) is deposited by an epi process in the recesses 260 of the substrate 210 to form SiGe source and drain features 262 in a crystalline state on the silicon substrate 210. The SiGe source and drain features 262 may alternatively be referred to as raised source and drain regions. The source and drain features 262 of the PFET device associated with the gate structure 221 may be in-situ doped or undoped during the epi process. When the source and drain features are undoped, it is understood that they may be doped in a subsequent process. The doping may be achieved by an ion implantation process, plasma immersion ion implantation (PHI) process, gas and/or solid source diffusion process, other suitable process, or combinations thereof. The source and drain features 262 may further be exposed to annealing processes, such as a rapid thermal annealing process.

Figure 10:
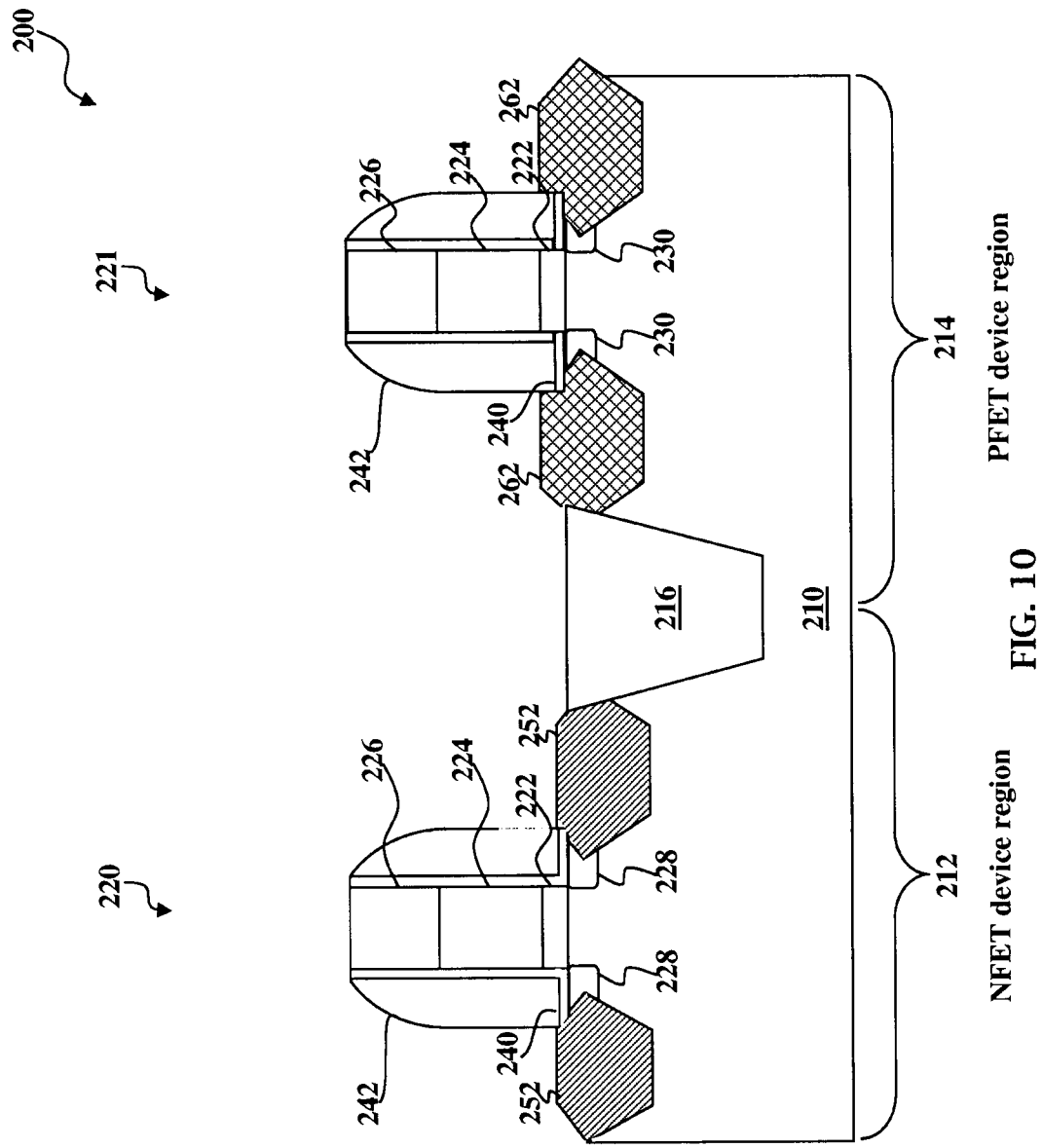

Thereafter, the patterned capping layers 254 and 256 are removed by a suitable process as illustrated in FIG. 10. The integrated circuit device 200 continues with processing to complete fabrication as discussed briefly below. For example, heavily doped source/drain (HDD) regions for the NFET device in the NFET device region 212 may be formed by ion implantation of n-type dopants, such as phosphorous or arsenic, and HDD regions for the PFET device in the PFET device region 214 may be formed by ion implantation of p-type dopants, such as boron. It is understood that the HDD regions of the NFET and PFET device regions 212 and 214 may be formed earlier than in the depicted embodiment. Additionally, silicide features are formed on the raised source/drain features, for example, to reduce the contact resistance. The silicide features may be formed on the source and drain regions by a process including depositing a metal layer, annealing the metal layer such that the metal layer is able to react with silicon to form silicide, and then removing the non-reacted metal layer.

An inter-level dielectric (ILD) layer is formed on the substrate and a chemical mechanical polishing (CMP) process is further applied to the substrate to planarize the substrate. Further, a contact etch stop layer (CESL) may be formed on top of the gate structures 220 and 221 before forming the ILD layer. In an embodiment, the gate electrode 224 remains poly in the final device. In another embodiment, the poly is removed and replaced with a metal in a gate last or gate replacement process. In a gate last process, the CMP process on the ILD layer is continued to expose the poly of the gate structures, and an etching process is performed to remove the poly, thereby forming trenches. The trenches are filled with a proper work function metal (e.g., p-type work function metal and n-type work function metal) for the PFET devices and the NFET devices.

A multilayer interconnection (MLI) including metal layers and inter-metal dielectric (IMD) is formed over the substrate 210 to electrically connect various features or structures of the integrated circuit device 200. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper multilayer interconnection structure.

Figure 11:
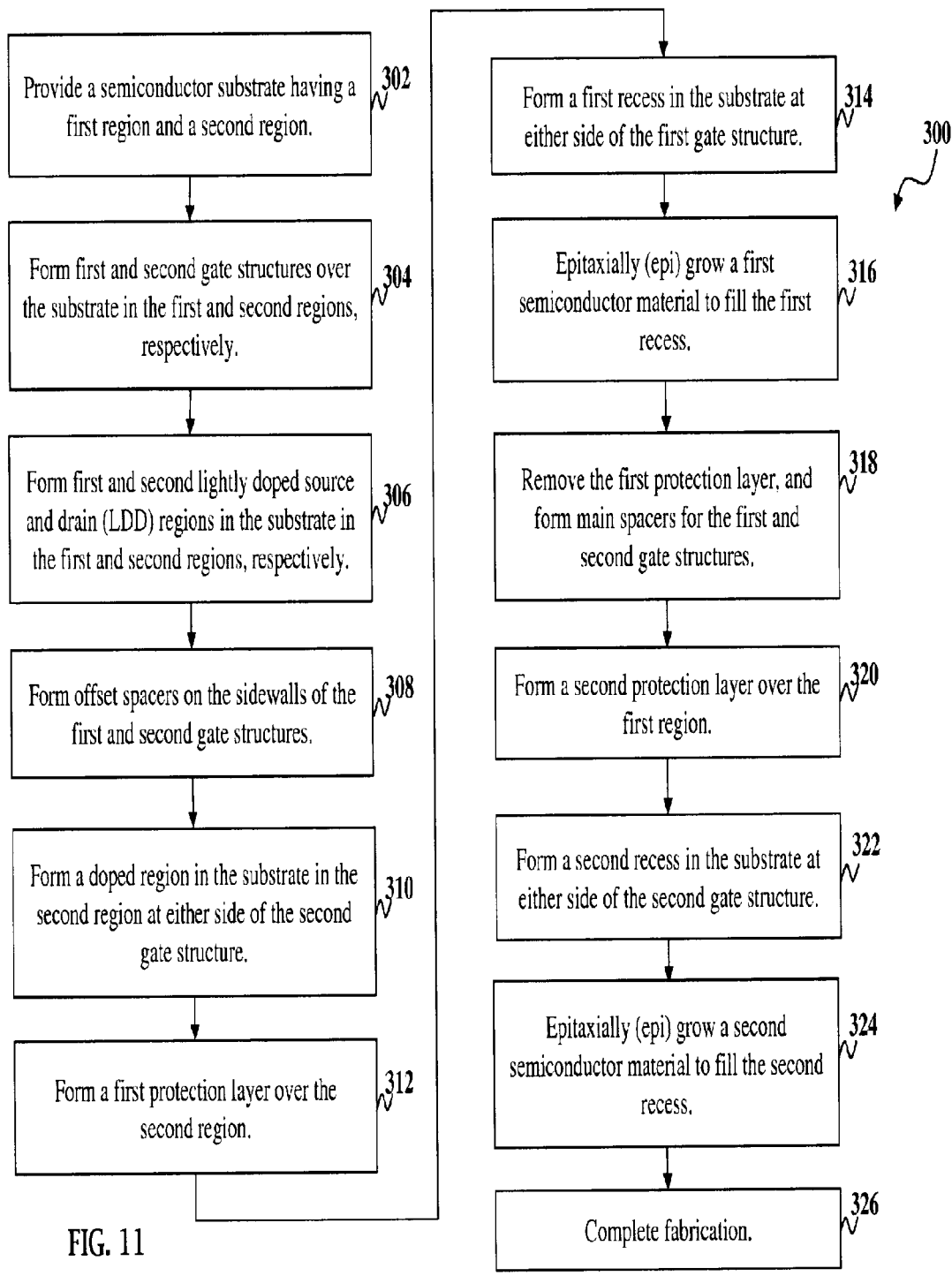
FIG. 11 is a flow chart of a method for fabricating an integrated circuit device according to another embodiment of the present disclosure.

FIG. 11 is a flow chart of another embodiment of a method 300 for fabricating an integrated circuit device according to various aspects of the present disclosure. The method 300 begins at block 302 where a semiconductor substrate having first and second regions is provided. At block 304, first and second gate structures are formed over the substrate in the first and second regions, respectively. At block 306, first and second lightly doped source and drain (LDD) regions are formed in the substrate in the first and second regions, respectively. The method continues with block 308 where a offset spacers are formed on the sidewalls of the first and second gate structures. At block 310, a doped region is formed in the substrate in the second region at either side of the second gate structure. The doped region includes a dopant of a type opposite a dopant used to form the second LDD region.

At blocks 312 and 314, a first protection layer is formed over the second region, and a first recess is formed in the substrate at either side of the first gate structure in the first region. The method continues at block 316 where a first semiconductor material is epitaxially grown to fill the first recess, thereby forming source and drain features in the first region. At block 318, the first protection layer is removed from the second region, and main spacers are formed for the first and second gate structures. The main spacers may be formed adjacent the sidewall spacers. At blocks 320 and 322, a second protection layer is formed over the first region, and a second recess is formed in the substrate at either side of the second gate structure. At block 324, a second semiconductor material is epitaxially grown to fill the second recess, thereby forming source and drain features for the second region. The method 300 continues with block 326 where fabrication of the integrated circuit device is completed. Additional steps can be provided before, during, and after the method 300, and some of the steps described can be replaced or eliminated for additional embodiments of the method. The discussion that follows illustrates various embodiments of an integrated circuit device that can be fabricated according to the method 300 of FIG. 11.

FIGS. 12-21 are various diagrammatic cross-sectional views of an embodiment of an integrated circuit device 400 during various fabrication stages according to the method 300 of FIG. 11. FIGS. 12-21 have been simplified for the sake of clarity to better understand the inventive concepts of the present disclosure. In the depicted embodiment, as will be further discussed below, the integrated circuit device 400 includes field effect transistor devices, specifically an n-channel field effect transistor (NFET) and a p-channel field effect transistor (PFET). The integrated circuit device 400 can further include memory cells and/or logic circuits, passive components such as resistors, capacitors, inductors, and/or fuses; and active components, such as metal-oxide-semiconductor field effect transistors (MOSFETs), complementary metal-oxide-semiconductor transistors (CMOSs), high voltage transistors, and/or high frequency transistors; other suitable components; or combinations thereof. Additional features can be added in the integrated circuit device 400, and some of the features described below can be replaced or eliminated for additional embodiments of the integrated circuit device 400.

Figure 12:
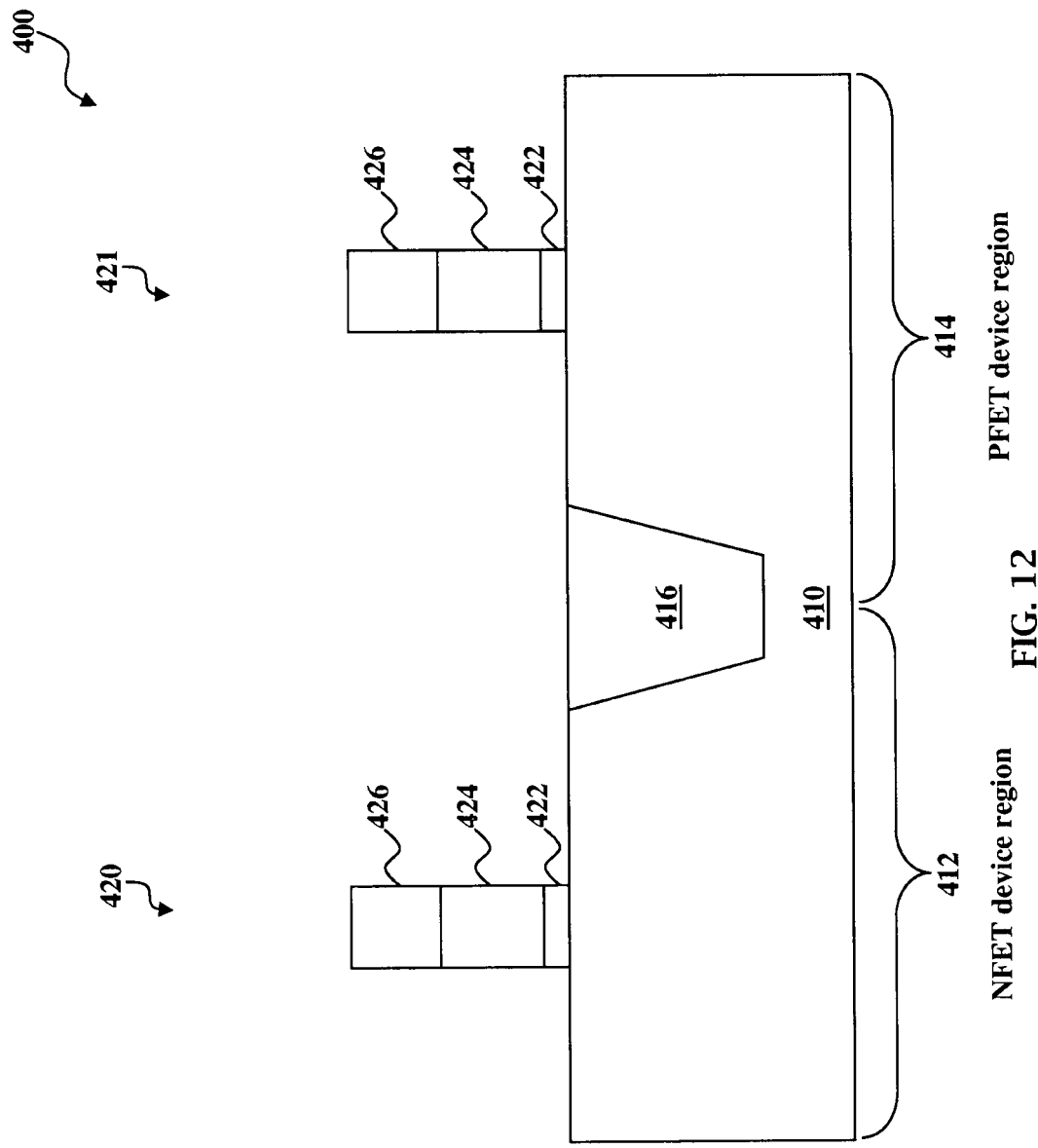
FIGS. 12-21 are various diagrammatic cross-sectional views of an embodiment of an integrated circuit device during various fabrication stages according to the method of FIG. 12.

In FIG. 12, a substrate 410 is provided. In the depicted embodiment, the substrate 410 is a semiconductor substrate including silicon. The substrate may be a p-type or n-type substrate. Alternatively, the substrate 410 comprises another elementary semiconductor, such as germanium; a compound semiconductor including silicon carbide, gallium arsenic, gallium phosphide, indium phosphide, indium arsenide, and/ or indium antimonide; an alloy semiconductor including SiGe, GaAsP, AlInAs, AlGaAs, GaInAs, GaInP, and/or GaInAsP; or combinations thereof. In yet another alternative, the substrate 410 is a semiconductor on insulator (SOI). In other alternatives, semiconductor substrate 410 may include a doped epi layer, a gradient semiconductor layer, and/or a semiconductor layer overlying another semiconductor layer of a different type, such as a silicon layer on a silicon germanium layer.

The substrate 410 may include various doped regions depending on design requirements as known in the art (e.g., p-type wells or n-type wells). The doped regions may be doped with p-type dopants, such as boron or $BF_2$; n-type dopants, such as phosphorus or arsenic; or a combination thereof. The doped regions may be formed directly on the substrate 410, in a P-well structure, in a N-well structure, in a dual-well structure, or using a raised structure. The integrated circuit device 400 includes a device region 412 and another device region 414 of the substrate 410, and thus, the substrate 410 may include various doped regions configured for a particular device in each region 412 and 414. In the depicted embodiment, the NFET will be formed in the device region 412, which is referred to as an NFET device region, and the PFET device will be formed in the device region 414, which is referred to as a PFET device region. Accordingly, the device region 412 may include a doped region configured for an NFET device, and the device region 414 may include a doped region configured for a PFET device.

Isolation feature 416 is formed in the substrate 410 to isolate various regions of the substrate 410, such as device regions 412 and 414. The isolation feature 416 also isolates the device regions 412 and 414 from other devices (not shown). The isolation feature 416 utilizes isolation technology, such as local oxidation of silicon (LOCOS) and/or shallow trench isolation (STI), to define and electrically isolate the various regions. The isolation feature 416 comprises silicon oxide, silicon nitride, silicon oxynitride, other suitable materials, or combinations thereof. The isolation feature 416 is formed by any suitable process. As one example, forming an STI includes a photolithography process, etching a trench in the substrate (for example, by using a dry etching and/or wet etching), and filling the trench (for example, by using a chemical vapor deposition process) with one or more dielectric materials. For example, the filled trench may have a multi-layer structure, such as a thermal oxide liner layer filled with silicon nitride or silicon oxide. In another example, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

The integrated circuit device 400 includes a gate structure 420 for the NFET device and a gate structure 421 for the PFET device. The gate structure 420 is disposed over the substrate 410 in NFET device region 412, and the gate structure 421 is disposed over the substrate 410 in PFET device region 414. In the depicted embodiment, the gate structures 420 and 421 include a gate dielectric layer 422, a gate layer 424 (referred to as a gate electrode), and a hard mask layer 426. The gate dielectric layer 422, gate layer 424, and hard mask layer 426 form gate stacks for the gate structures 420 and 421. The gate stacks 420 and 421 may include additional layers as is known in the art. The gate structures 420 and 421 are formed by deposition, lithography patterning, etching processes, or combination thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable deposition methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the photolithography exposing process is implemented or replaced by other proper methods, such as maskless photolithography, electron-beam writing, or ion-beam writing. The etching processes include dry etching, wet etching, other etching methods, or combinations thereof. The gate structures 420 and 421 may be formed simultaneously, utilizing the same processing steps and processing materials; independently of one another, utilizing varying processing steps and processing materials; or using a combination of simultaneous and independent processing steps and processing materials.

The gate dielectric layer 422 is formed over the substrate 410 and includes a dielectric material, such as silicon oxide, silicon oxynitride, silicon nitride, a high-k dielectric material, other suitable dielectric material, or combinations thereof. Exemplary high-k dielectric materials include $HfO_2$, HfSiO, HfSiON, HfTaO, HfTiO, HfZrO, other suitable materials, or combinations thereof. The gate dielectric layer 422 may include a multilayer structure. For example, the gate dielectric layer 422 may include an interfacial layer, and a high-k dielectric material layer formed on the interfacial layer. An exemplary interfacial layer may be a grown silicon oxide layer formed by a thermal process or ALD process.

The gate layer 424 is formed over the gate dielectric layer 422. In the present embodiment, the gate layer 424 is a polycrystalline silicon (polysilicon) layer. The polysilicon layer may be doped for proper conductivity. Alternatively, the polysilicon is not necessarily doped if a dummy gate is to be formed and replaced in a subsequent gate replacement process. Alternatively, the gate layer 424 could include a conductive layer having a proper work function, therefore, the gate layer 424 can also be referred to as a work function layer. The work function layer comprises any suitable material, such that the layer can be tuned to have a proper work function for enhanced performance of the associated device. For example, if a p-type work function metal (p-metal) for the PFET device is desired, TiN or TaN may be used. On the other hand, if an n-type work function metal (n-metal) for the NFET device is desired, Ta, TiAl, TiAlN, or TaCN, may be used. The work function layer may include doped conducting oxide materials. The gate layer 424 may include other conductive materials, such as aluminum, copper, tungsten, metal alloys, metal silicide, other suitable materials, or combinations thereof. For example, where the gate layer 424 includes a work function layer, another conductive layer can be formed over the work function layer.

The hard mask layer 426 is formed over the gate layer 424. The hard mask layer 426 includes silicon oxide, silicon nitride, silicon oxynitride, silicon carbide, other suitable dielectric material, or combinations thereof. The hard mask layer 426 may have a multi-layer structure.

Figure 13:
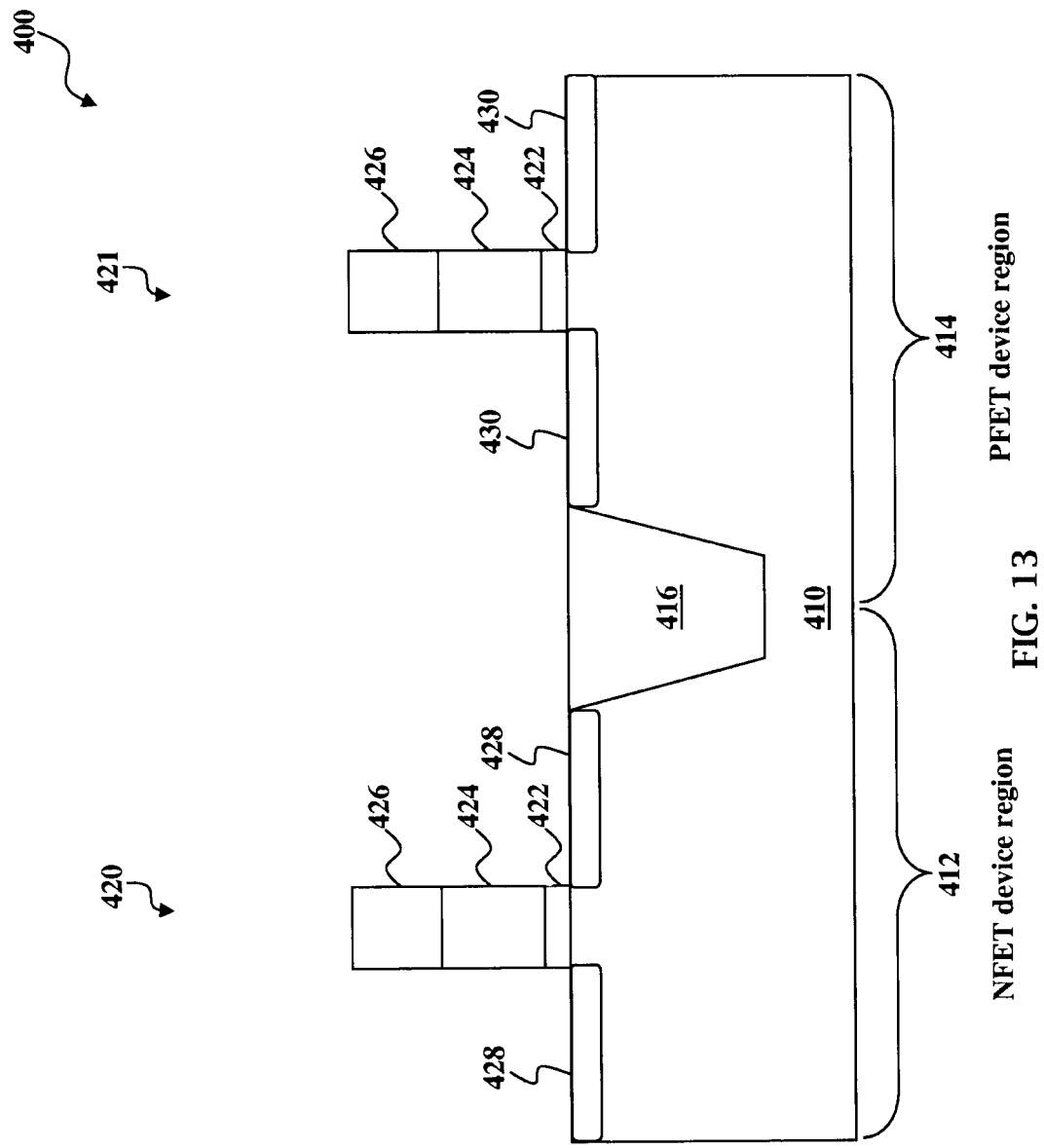

In FIG. 13, lightly doped source/drain (LDD) regions are formed in source and drain regions of the substrate 410 in the device regions 412 and 414. In the depicted embodiment, LDD regions 428 are formed in the substrate 410, interposed by the gate structure 420, in the NFET device region 412; and LDD regions 430 are formed in the substrate 410, interposed by the gate structure 421, in the PFET device region 414. The LDD regions 428 and 430 are aligned with the sidewalls of the gate stacks of the gate structures 420 and 421. The LDD regions 428 and 430 are formed by an ion implantation process, diffusion process, other suitable process, or combination thereof. The PFET device region 414 may be protected during formation of the LDD regions 428 in the NFET device region 412, and the NFET device region 412 may be protected during formation of the LDD regions 430 in the PFET device region 414. For example, a photoresist layer or hard mask layer may be deposited and patterned over the PFET device region 414 during formation of the LDD regions 428 in the NFET device region 412, and a photoresist layer or hard mask layer can be deposited and patterned over the NFET device region 412 during formation of the LDD regions 430 in the PFET device region 414. In the depicted embodiment, the LDD regions 428 for the NFET device (NLDD) are doped with an n-type dopant, such as phosphorous or arsenic, and the LDD regions 430 for the PFET device (PLDD) are doped with a p-type dopant, such as boron or $BF_2$.

Figure 14:
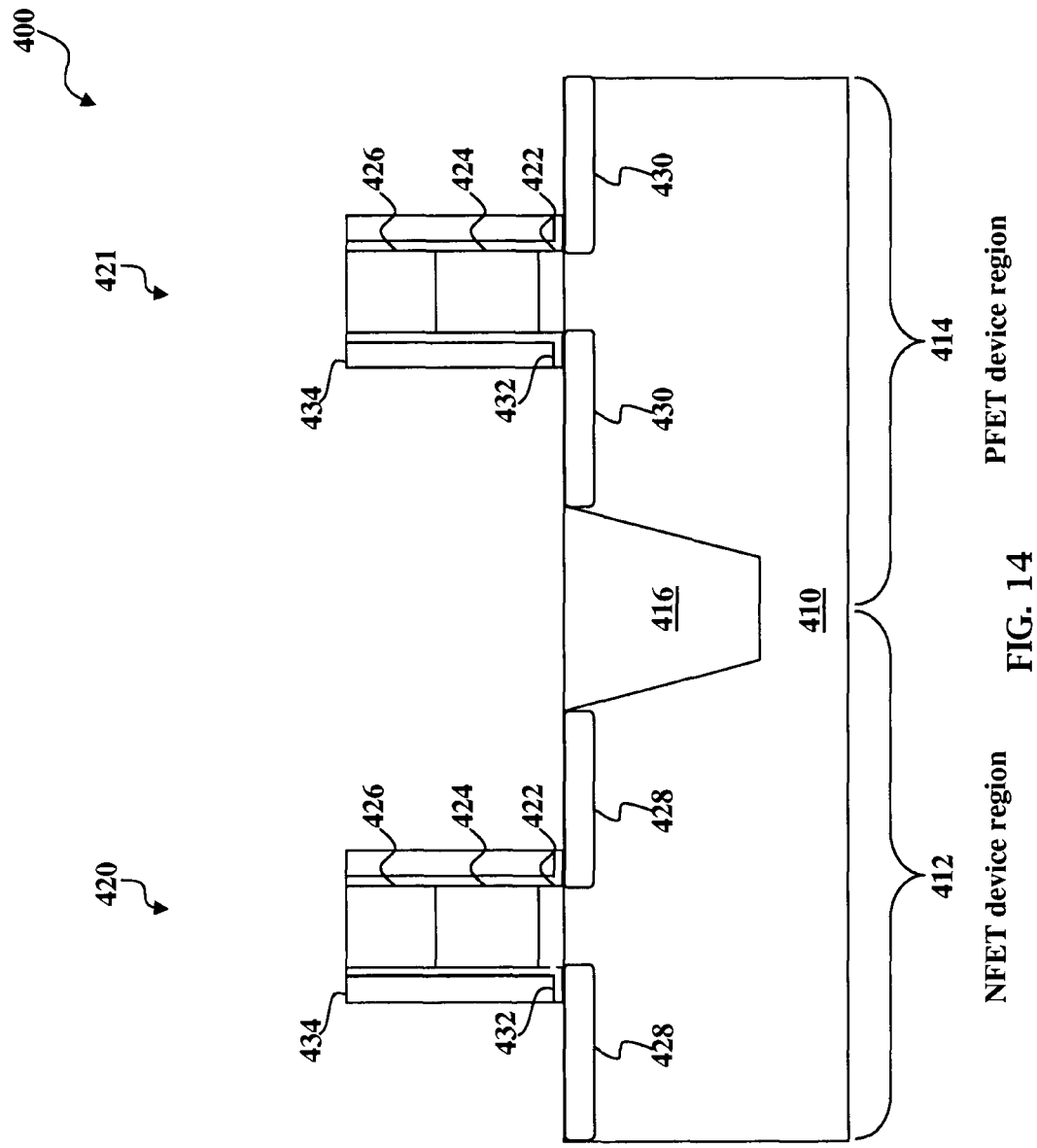

In FIG. 14, spacer liner 432 and offset (dummy) spacers 434 may be formed for the gate structures 420 and 421. In the depicted embodiment, the spacer liner 432 comprises an oxide material, such as silicon oxide, and the offset spacers 434 comprise a nitride material, such as silicon nitride. Alternatively, the offset spacers 434 includes another suitable dielectric material, such as silicon oxide, silicon oxynitride, or combinations thereof. The spacer liner 432 may also comprise another suitable dielectric material. The spacer liner 432 and offset spacers 434 are formed by a suitable process. For example, the spacer liner 432 and offset spacers 434 are formed by blanket depositing a first dielectric layer (a silicon oxide layer) over the integrated circuit device 400 and a second dielectric layer (a silicon nitride layer) over the first dielectric layer, and then, anisotropically etching to remove the dielectric layers to form the spacer liner 432 and offset spacers 434 as illustrated in FIG. 14. The spacer liner 432 and offset spacers 434 are positioned adjacent the sidewalls of the gate stacks (gate dielectric layer 422, gate layer 424, and hard mask layer 426) of the gate structures 420 and 421.

Figure 15:
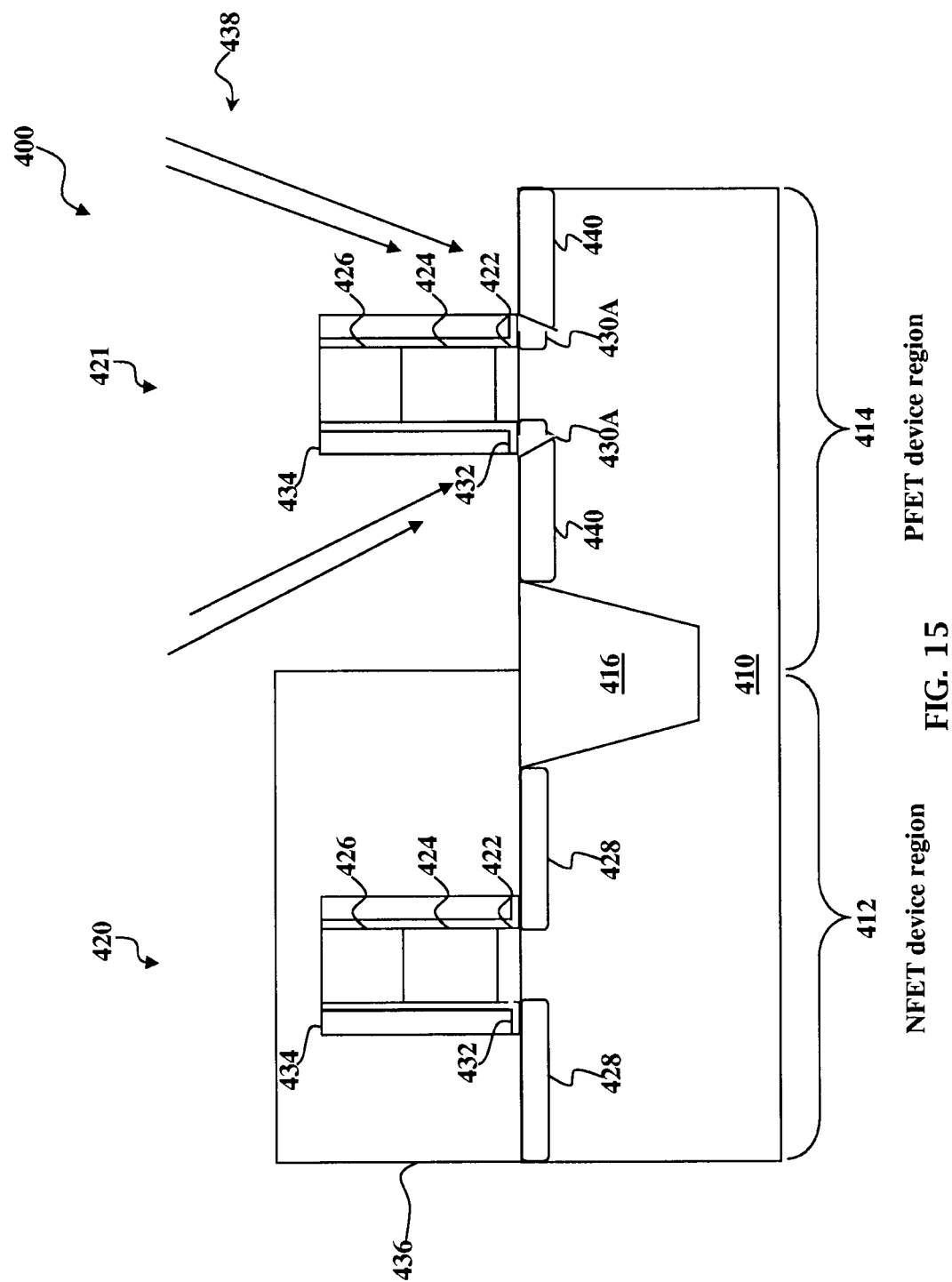

In FIG. 15, doped regions are formed in the substrate 410 in the PFET device region 414. A resist layer (or hard mask layer) 436 is deposited and patterned over the NFET device region 412, and an implantation process 438 is performed on the PFET device region 414 to form doped regions 440 in the substrate 410 in the PFET device region 414. The implantation process 438 is a tilt-angle ion implantation. The tilt-angle ion implantation process implements an ion beam with an angle to a direction perpendicular to the substrate 410. In the depicted embodiment, a tilt-angle of about 15° to about 25° is utilized. The implantation process 438 utilizes a dopant type opposite the dopant type of the LDD regions 430. In the depicted embodiment, since the LDD regions 430 are doped with a p-type dopant, the doped regions 440 are doped with an n-type dopant, such as phosphorous or arsenic. The doped regions 440 in the substrate 410 are interposed by the gate structure 421, similar to the LDD regions 430, yet the doped regions 440 are aligned with the offset spacers 434 and spaced a distance away from the gate structure 421. After the implantation process 438, LDD regions 430A remain in the substrate 410 in the PFET device region 414. As further discussed below, since the doped regions 440 have a different doping species than the remaining LDD regions 430A, the etching rate of the substrate 410 including the doped regions 440 is greater than the substrate 410 including the LDD regions 430A. Thereafter, the patterned resist layer 436 is removed by a photoresist stripping process, for example.

Figure 16:
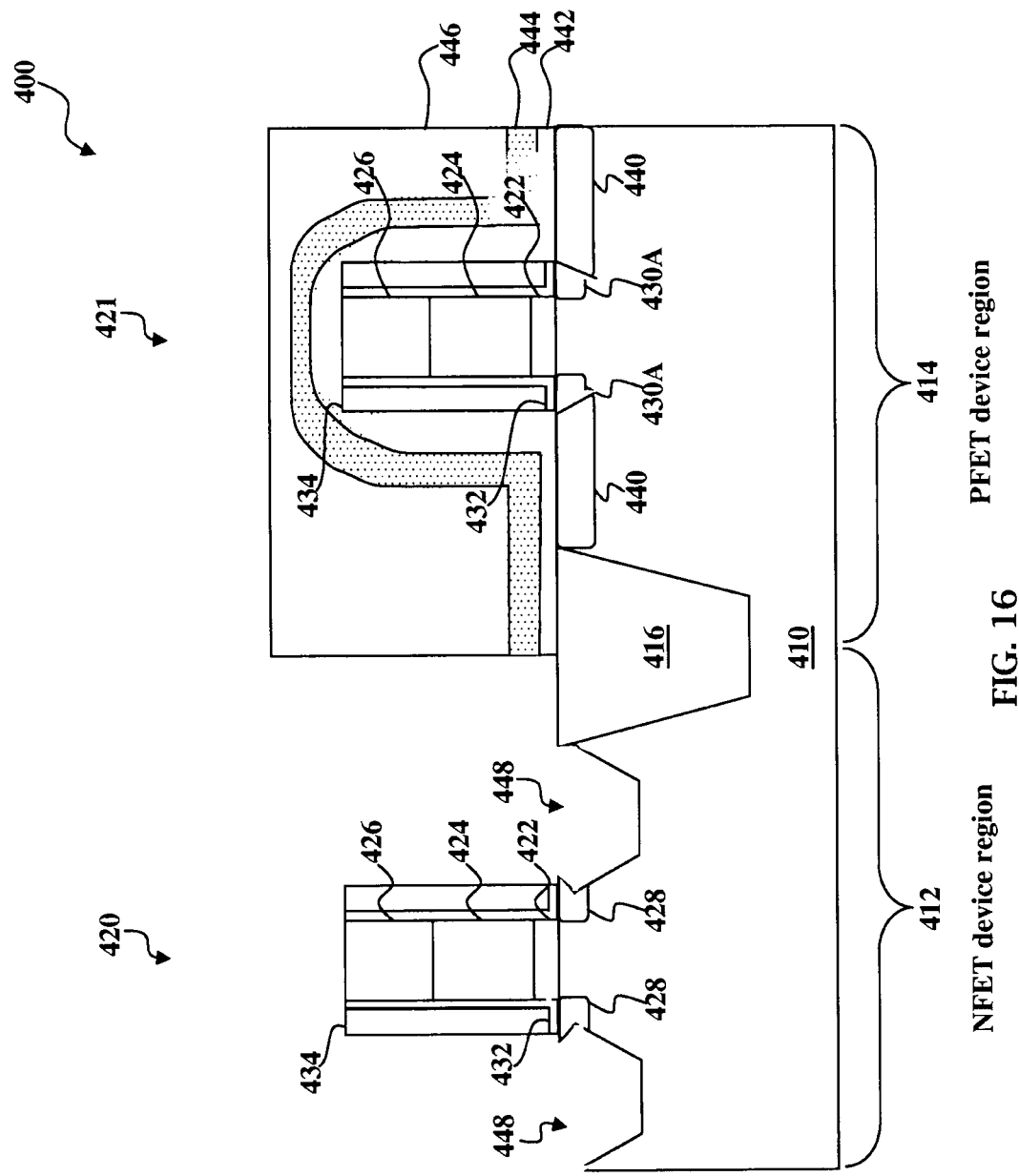
Figure 17:
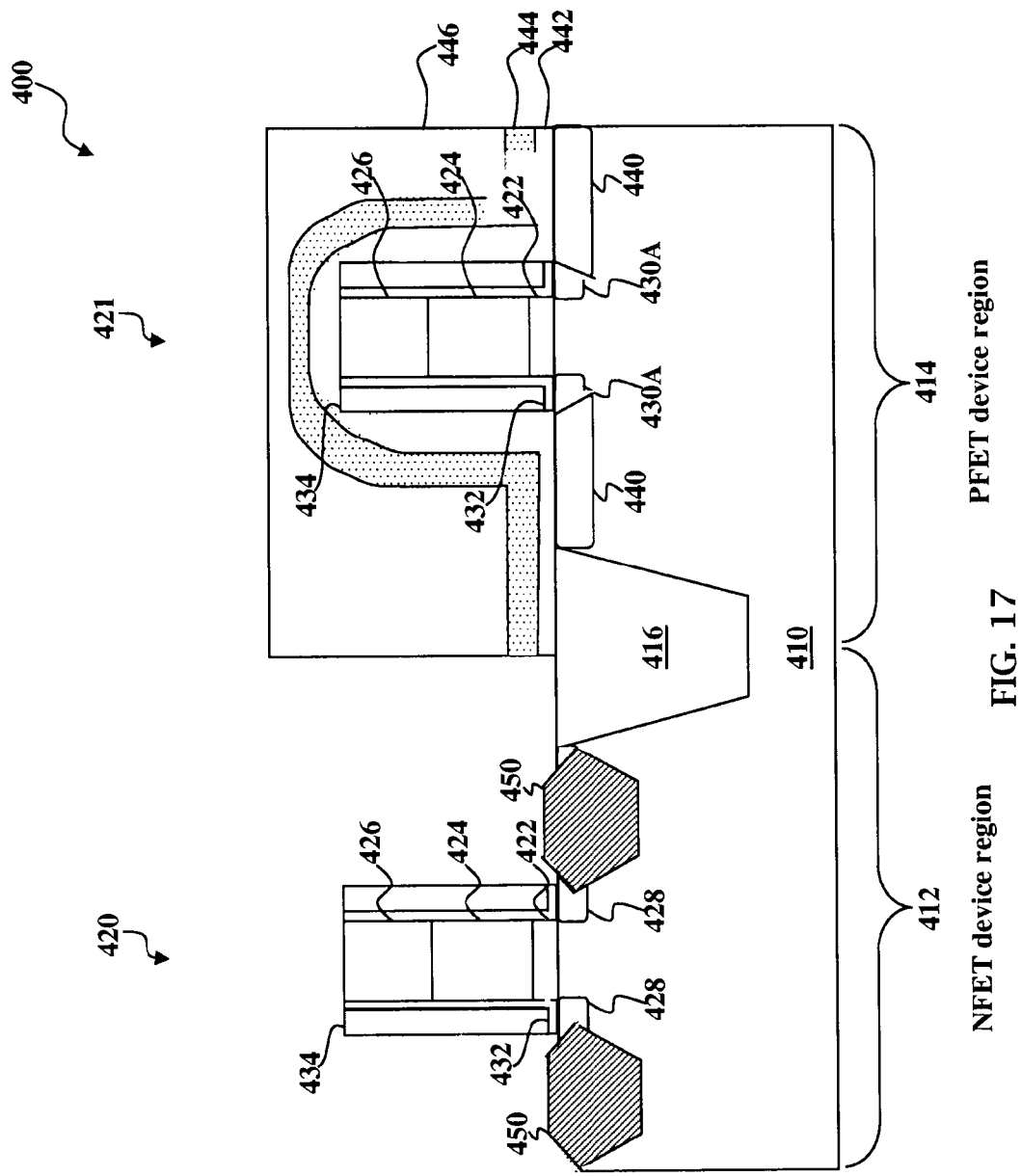

In FIGS. 16-21, source/drain engineering is performed to configure the source/drain region of the NFET device region 412 for an NFET device and to configure the source/drain region of the PFET device region 414 for a PFET device. In FIGS. 16 and 17, source/drain (S/D) features are formed in the NFET device region 412. For example, in FIG. 16, portions of the substrate 410 are removed at either side of the gate structure 420 in the NFET device region 412, particularly in the source and drain region of the NFET device. In the depicted embodiment, a capping layer 442, another capping layer 444, and a photoresist layer 446 are formed over the integrated circuit device 400 and patterned to protect the PFET device during processing of the NFET device region 412. The capping layer 442 may comprise an oxide material, and capping layer 444 may comprise a nitride material. The capping layers 442 and 444 may comprise other suitable materials as known in the art. The photoresist layer 446 may include an antireflective coating layer, such as a bottom antireflective coating (BARC) layer and/or a top antireflective coating (TARC) layer. The patterned layers 442, 444, and 446 may be formed by a photolithography process. An exemplary photolithography process may include processing steps of photoresist coating, soft baking, mask aligning, exposing, post-exposure baking, developing photoresist, and hard baking. The photolithography process may also be implemented or replaced by other proper techniques, such as maskless photolithography, electron-beam writing, ion-beam writing, and molecular imprint.

An etching process then removes portions of the substrate 410 to form recesses 448 in the substrate 410. The recesses 448 are formed in the source and drain regions of the NFET device in the NFET device region 412. The etching process includes a dry etching process, wet etching process, or combination thereof. In the depicted embodiment, the etching process utilizes a combination dry and wet etching. The dry and wet etching processes have etching parameters that can be tuned, such as etchants used, etching temperature, etching solution concentration, etching pressure, source power, RF bias voltage, RF bias power, etchant flow rate, and other suitable parameters. For example, the dry etching process may utilize an etching pressure of about 1 mT to about 200 mT, a source power of about 200 W to about 2000 W, an RF bias voltage of about 0 V to about 100 V, and an etchant that includes $NF_3$, $Cl_2$, $SF_6$, He, Ar, $CF_4$, or combinations thereof. In an example, the dry etching process includes an etching pressure of about 1 mT to about 200 mT, a source power of about 200 W to about 2000 W, an RF bias voltage of about 0 V to about 100 V, a $NF_3$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In another example, the etching process includes an etching pressure of about 1 mT to about 200 mT, a source power of about 200 W to about 2000 W, an RF bias voltage of about 0 V to about 100 V, a $SF_6$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In yet another example, the etching process includes an etching pressure of about 1 mT to about 200 mT, a source power of about 200 W to about 2000 W, an RF bias voltage of about 0 V to about 100 V, a $CF_4$ gas flow of about 0 sccm to about 100 sccm, a $Cl_2$ gas flow of about 0 sccm to about 100 sccm, an He gas flow of about 0 sccm to about 500 sccm, and an Ar gas flow of about 0 sccm to about 500 sccm. The wet etching solutions may include $NH_4OH$, HF (hydrofluoric acid), TMAH (tetramethylammonium hydroxide), other suitable wet etching solutions, or combinations thereof. In an example, the wet etching process first implements a 100:1 concentration of an HF solution at room temperature, and then implements a NH$_4$OH solution at a temperature of about 20° C. to about 60° C. In another example, the wet etching process first implements a 100:1 concentration of an HF solution at room temperature, and then implements a TMAH solution at a temperature of about 20° C. to about 60° C. After the etching process, a pre-cleaning process may be performed to clean the recesses 448 with a hydrofluoric acid (HF) solution or other suitable solution.

In FIG. 17, a semiconductor material is deposited in the recesses 448 to form source and drain features 450. The source and drain features 450 may alternatively be referred to as raised source and drain regions. In the depicted embodiment, an epitaxy or epitaxial (epi) process is performed to deposit the semiconductor material in the recesses 448. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combination thereof. The epi process may use gaseous and/or liquid precursors, which may interact with the composition of the substrate 410. In the depicted embodiment, the source and drain features 450 include epitaxially grown silicon (epi Si). The Si epi source and drain features 450 of the NFET device associated with the gate structure 420 may be in-situ doped or undoped during the epi process. For example, the Si epi source and drain features 252 may be doped with phosphorous to form Si:P source and drain features. When the source and drain features are undoped, it is understood that they may be doped in a subsequent process. The doping may be achieved by an ion implantation process, plasma immersion ion implantation (PIII) process, gas and/or solid source diffusion process, other suitable process, or combinations thereof. The source and drain features 450 may further be exposed to annealing processes, such as a rapid thermal annealing process. Thereafter, the patterned layers 442, 444, and 446 are removed by a suitable process.

Figure 18:
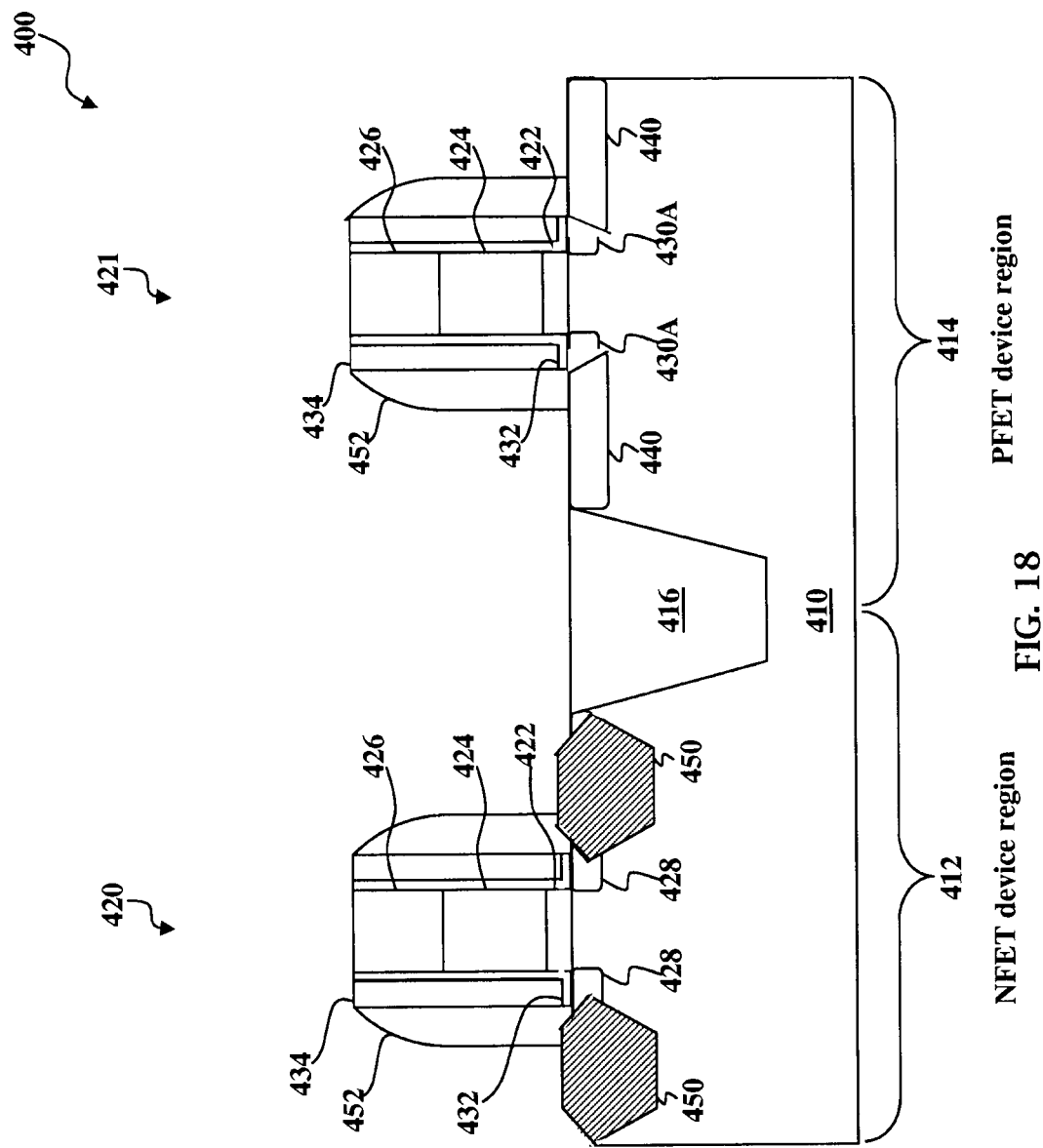

In FIG. 18, spacers 452 (referred to as main spacers) are formed for the gate structures 420 and 421 by a suitable process. For example, the spacers 452 are formed by blanket depositing a dielectric layer, such as a silicon nitride layer, over the integrated circuit device 400, and then, anisotropically etching to remove the dielectric layer to form the spacers 452 as illustrated in FIG. 18. The spacers 452 are positioned on the sidewalls of the gate structures 420 and 421, and in the depicted embodiment, adjacent the offset spacers 434. The spacers 452 comprise a dielectric material, such as silicon nitride, silicon oxide, silicon oxynitride, other suitable materials, or combinations thereof.

Figure 19A:
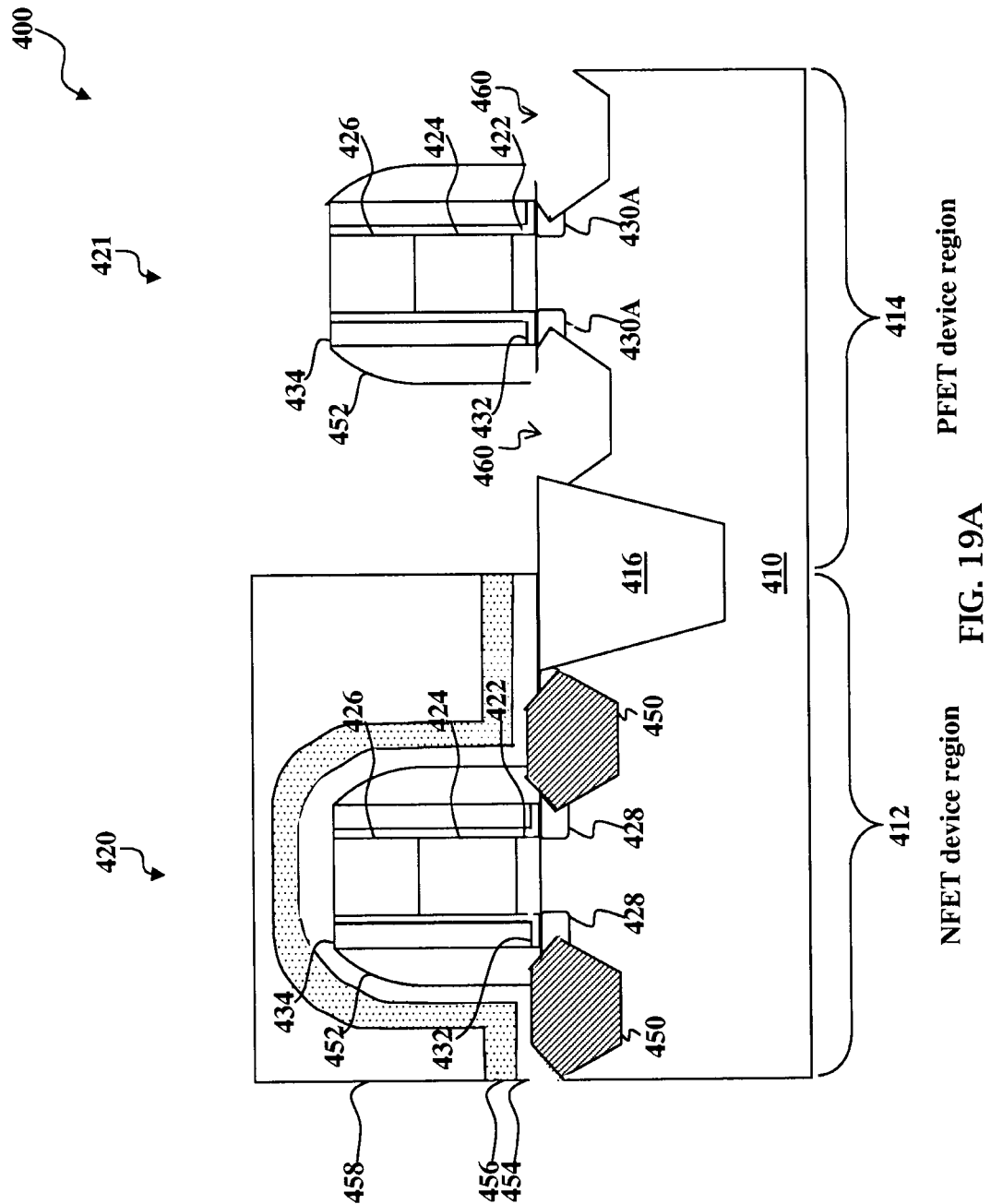
Figure 19B:
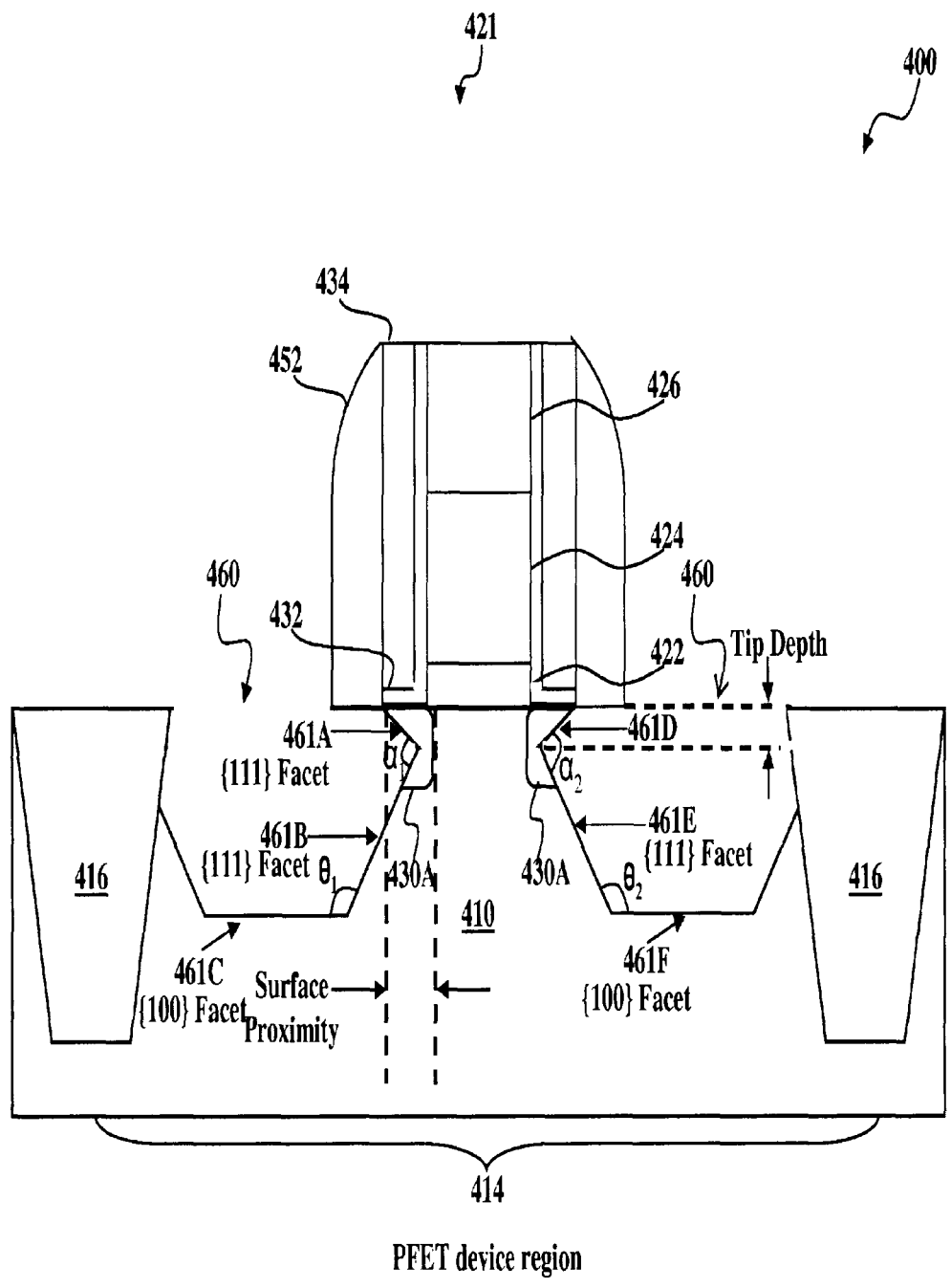
Figure 20:
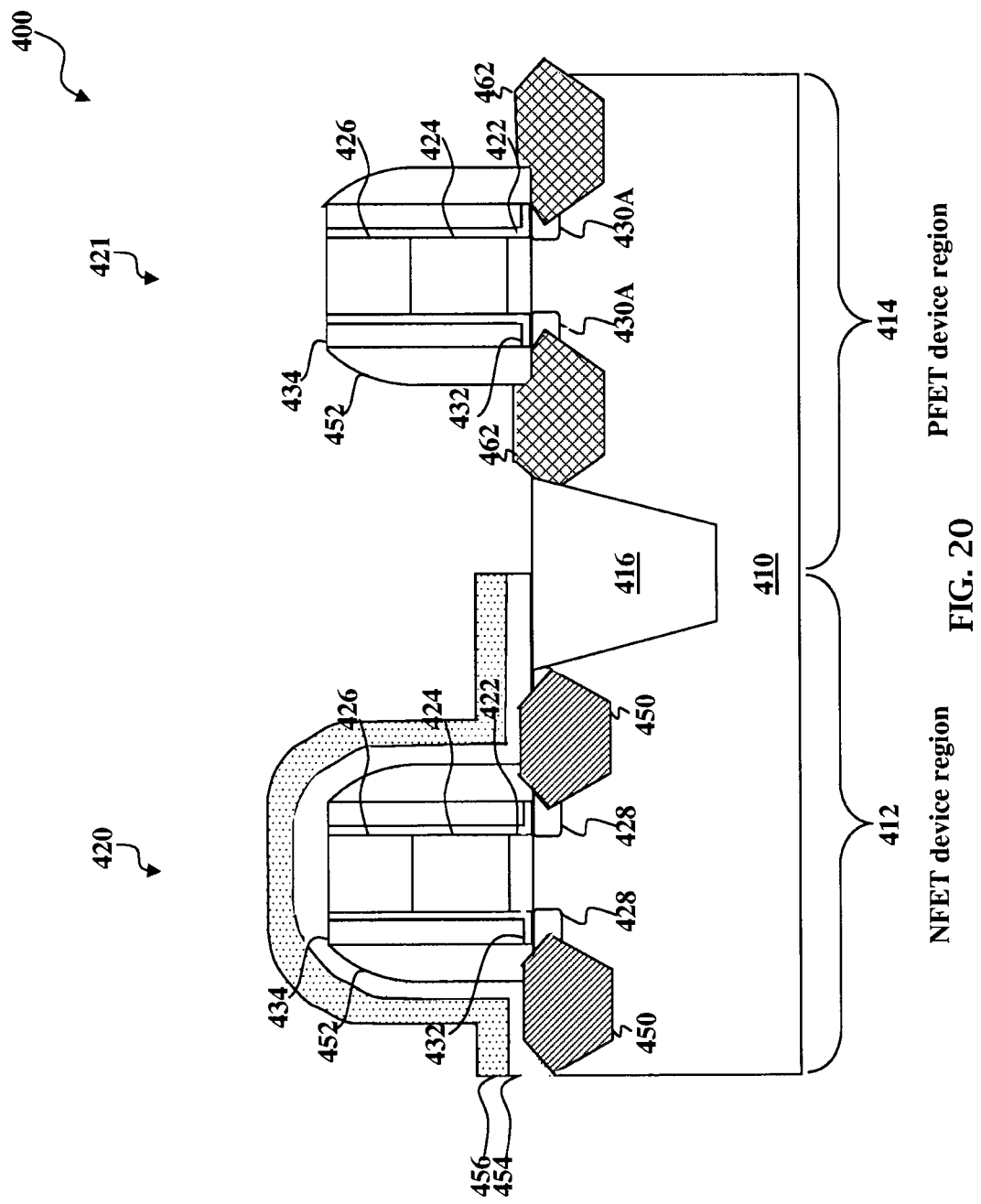

In FIGS. 19A, 19B, and 20, source/drain (S/D) features are formed in the PFET device region 414. For example, in FIG. 19A, portions of the substrate 410 are removed at either side of the gate structure 421 in the PFET device region 414, particularly in the source and drain region of the PFET device. In the depicted embodiment, a capping layer 454, another capping layer 456, and a photoresist layer 458 are formed over the integrated circuit device 400 and patterned to protect the NFET device during processing of the PFET device region 414. The capping layer 454 may comprise an oxide material, and capping layer 456 may comprise a nitride material. The capping layers 454 and 456 may comprise other suitable materials as known in the art. The photoresist layer 458 may include an antireflective coating layer, such as a BARC layer and/or a TARC layer. The patterned layers 454, 456, and 458 may be formed by a photolithography process. An exemplary photolithography process may include processing steps of photoresist coating, soft baking, mask aligning, exposing, post-exposure baking, developing photoresist, and hard baking. The photolithography process may also be implemented or replaced by other proper techniques, such as maskless photolithography, electron-beam writing, ion-beam writing, and molecular imprint.

An etching process then removes portions of the substrate 410 to form recesses 460 in the substrate 410. The recesses 460 are formed in the source and drain regions of the PFET device in the PFET device region 414. The etching process includes a dry etching process, wet etching process, or combination thereof. In the depicted embodiment, the etching process utilizes a combination dry and wet etching. The dry and wet etching processes have etching parameters that can be tuned, such as etchants used, etching temperature, etching solution concentration, etching pressure, source power, RF bias voltage, RF bias power, etchant flow rate, and other suitable parameters. For example, the dry etching process may utilize an etching pressure of about 1 mT to about 200 mT, a source power of about 200 W to about 2000 W, an RF bias voltage of about 0 V to about 100 V, and an etchant that includes NF$_3$, Cl$_2$, SF$_6$, He, Ar, CF$_4$, or combinations thereof. In an example, the dry etching process includes an etching pressure of about 1 mT to about 200 mT, a source power of about 200 W to about 2000 W, an RF bias voltage of about 0 V to about 100 V, a NF$_3$ gas flow of about 5 sccm to about 30 sccm, a Cl$_2$ gas flow of about 0 sccm to about 100 sccm, an He gas flow of about 0 sccm to about 500 sccm, and an Ar gas flow of about 0 sccm to about 500 sccm. In another example, the etching process includes an etching pressure of about 1 mT to about 200 mT, a source power of about 200 W to about 2000 W, an RF bias voltage of about 0 V to about 100 V, a SF$_6$ gas flow of about 5 sccm to about 30 sccm, a Cl$_2$ gas flow of about 0 sccm to about 100 sccm, an He gas flow of about 0 sccm to about 500 sccm, and an Ar gas flow of about 0 sccm to about 500 sccm. In yet another example, the etching process includes an etching pressure of about 1 mT to about 200 mT, a source power of about 200 W to about 2000 W, an RF bias voltage of about 0 V to about 100 V, a CF$_4$ gas flow of about 5 sccm to about 100 sccm, a Cl$_2$ gas flow of about 0 sccm to about 100 sccm, an He gas flow of about 0 sccm to about 500 sccm, and an Ar gas flow of about 0 sccm to about 500 sccm. The wet etching solutions may include NH$_4$OH, HF (hydrofluoric acid), TMAH (tetramethylammonium hydroxide), other suitable wet etching solutions, or combinations thereof. In an example, the wet etching process first implements a 100:1 concentration of an HF solution at room temperature, and then implements a NH$_4$OH solution at a temperature of about 20° C. to about 60° C. In another example, the wet etching process first implements a 100:1 concentration of an HF solution at room temperature, and then implements a TMAH solution at a temperature of about 20° C. to about 60° C. After the etching process, a pre-cleaning process may be performed to clean the recesses 460 with a hydrofluoric acid (HF) solution or other suitable solution.

The etching profile of the recesses 460 enhances performance of the integrated circuit device 400. In FIG. 19B, the PFET device region 414 of the integrated circuit device 400 is enlarged for better understanding of the etching profile of recesses 460. The etching profile of the recesses 460 defines source and drain regions of the PFET device, and the etching profile of the recesses is defined by facets 461A, 461B, 461C, 461D, 461E, and 461F of the substrate 410. The facets 461A, 461B, 461D, and 461E may be referred to as shallow facets, and the facets 461C and 461F may be referred to as bottom facets. In the depicted embodiment, the etching profile of the recesses 460 is defined by facets 461A, 461B, 461D, and 461E in a {111} crystallographic plane of the substrate 410, and facets 461C and 461F in a {100} crystallographic plane of the substrate 410. An angle $\alpha_1$ between the shallow facets 461A and 461B is from about 45.0° to about 80.0°, and an angle $\theta_1$ between the facets 461B and 461C is from about 50.0° to about 70.0°. An angle $\alpha_2$ between the shallow facets 461C and 461D is from about 45.0° to about 80.0°, and an angle $\theta_2$ between the facets 461E and 461F of the substrate 410 is from about 50.0° to about 70.0°. In the depicted embodiment, $\alpha_1$ and $\alpha_2$ are about 54.7°, and $\theta_1$ and $\theta_2$ are about 54.7°.

The recesses 460 further define a surface proximity and a tip depth (or height). The surface proximity defines a distance that a top surface of the substrate 410 extends from a sidewall of the gate structure 421 (i.e., gate stack including gate dielectric layer 422, gate layer 424, and hard mask layer 426) to the recess 460 (or when the recess is filled, a source and drain feature). In the depicted embodiment, the disclosed etching profile of the recesses 460 achieves a surface proximity of about 1 nm to about 3 nm. The tip depth defines a distance between a top surface of the substrate 410 and an intersection of the facets 461A and 461B (or an intersection of the facets 461D and 461E). In the depicted embodiment, the etching profile of the recesses 460 achieves a tip depth of about 5 nm to about 10 nm.

The etching profile of the recesses 460, which improves device performance, is achieved by the method 300 described herein. Typically, to enhance the performance of integrated circuit device 400, a trade-off occurs. For example, conventional processing reduces the surface proximity to improve saturation current, which often results in a larger tip height, thus leading to increased short channel effects and reduced on/off speed of the integrated circuit device. Accordingly, precise control over the etching profile of the recesses 460 is desired, particularly precise control over the resulting surface proximity and tip shape of the source and drain features. The disclosed method 300 provides this desired control, resulting in the etching profile of recesses 460 as described with reference to FIGS. 19A and 19B. In particular, referring to FIG. 15 above, doped regions 440 were formed in the source and drain regions of the PFET device, leaving LDD regions 430A. As noted above, the additional implantation process implemented to form the doped regions 440 enhances the etching rate of a surface area of the substrate 410 to etching processes used to from the recesses 460. In particular, a difference in etching rate between substrate 410 including the doped regions 440 and the substrate 410 including the LDD regions 430A is increased. The LDD regions 430A can thus act as a dry etch slow down and a wet etch stop to the etching processes used to form the recesses 460, allowing the LDD regions 430A to be designed to achieve a desired surface proximity and tip depth.

In FIG. 20, a semiconductor material is deposited in the recesses 460 to form a strained structure in the PFET device region 414. In the depicted embodiment, an epitaxy or epitaxial (epi) process is performed to deposit the semiconductor material in the recesses 460. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combination thereof. The epi process may use gaseous and/or liquid precursors, which may interact with the composition of the substrate 410. The deposited semiconductor material is different from the substrate 410. Accordingly, the channel region of the PFET device is strained or stressed to enhance carrier mobility of the device and enhance device performance. In the depicted embodiment, the patterned photoresist layer 458 protecting the NFET device region 412 is removed before the epi process. Further, in the depicted embodiment, silicon germanium (SiGe) is deposited by an epi process in the recesses 460 of the substrate 410 to form SiGe source and drain features 462 in a crystalline state on the silicon substrate 410. The SiGe source and drain features 462 may alternatively be referred to as raised source and drain features. The source and drain features 462 of the PFET device associated with the gate structure 221 may be in-situ doped or undoped during the epi process. When the source and drain features are undoped, it is understood that they may be doped in a subsequent process. The doping may be achieved by an ion implantation process, plasma immersion ion implantation (PIII) process, gas and/or solid source diffusion process, other suitable process, or combinations thereof. The source and drain features 462 may further be exposed to annealing processes, such as a rapid thermal annealing process.

Figure 21:
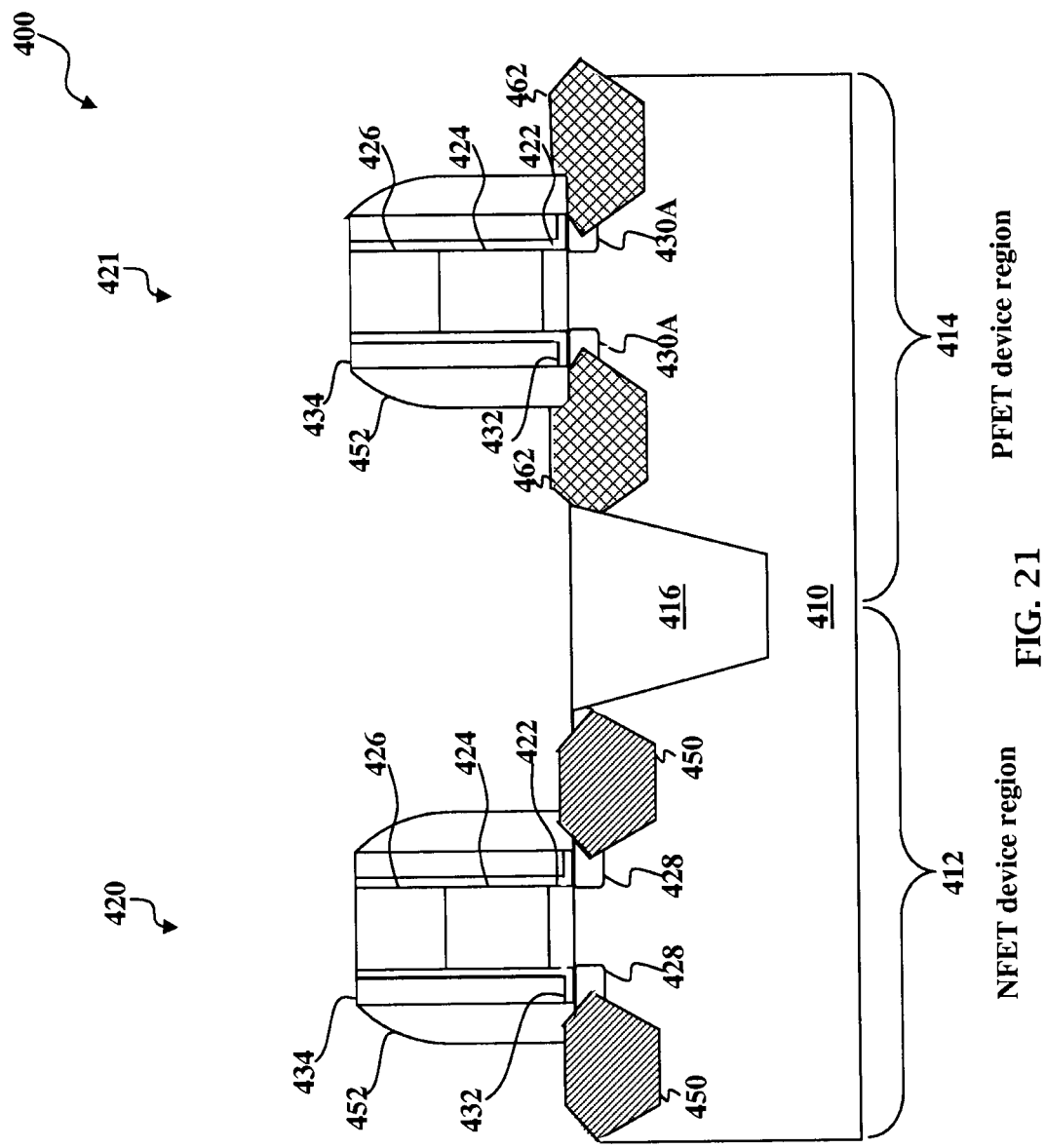

Thereafter, the patterned capping layers 454 and 456 are removed by a suitable process as illustrated in FIG. 21. The integrated circuit device 400 continues with processing to complete fabrication as discussed briefly below. For example, heavily doped source/drain (HDD) regions for the NFET device in the NFET device region 412 may be formed by ion implantation of n-type dopants, such as phosphorous or arsenic, and HDD regions for the PFET device in the PFET device region 414 may be formed by ion implantation of p-type dopants, such as boron. It is understood that the HDD regions of the NFET and PFET device regions 412 and 414 may be formed earlier than in the depicted embodiment. Additionally, silicide features are formed on the raised source/drain features, for example, to reduce the contact resistance. The silicide features may be formed on the source and drain regions by a process including depositing a metal layer, annealing the metal layer such that the metal layer is able to react with silicon to form silicide, and then removing the non-reacted metal layer.

An inter-level dielectric (ILD) layer is formed on the substrate and a chemical mechanical polishing (CMP) process is further applied to the substrate to planarize the substrate. Further, a contact etch stop layer (CESL) may be formed on top of the gate structures 420 and 421 before forming the ILD layer. In an embodiment, the gate electrode 424 remains poly in the final device. In another embodiment, the poly is removed and replaced with a metal in a gate last or gate replacement process. In a gate last process, the CMP process on the ILD layer is continued to expose the poly of the gate structures, and an etching process is performed to remove the poly, thereby forming trenches. The trenches are filled with a proper work function metal (e.g., p-type work function metal and n-type work function metal) for the PFET devices and the NFET devices.

A multilayer interconnection (MLI) including metal layers and inter-metal dielectric (IMD) is formed over the substrate 410 to electrically connect various features or structures of the integrated circuit device 400. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper multilayer interconnection structure.

The integrated circuit devices 200 and 400 serve only as examples. The integrated circuit devices 200 and 400 may be used in various applications such as digital circuitry, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other types of transistors, including single-gate transistors, double-gate transistors, and other multiple-gate transistors, and may be employed in many different applications, including sensor cells, memory cells, logic cells, and others.

In summary, the disclosed methods 100 and 300 provide improved control over surface proximity and tip depth in the integrated circuit devices 200 and 400. The improved control is achieved by, after forming LDD regions, performing an additional implant to form doped regions in the source and drain regions of a device. The doped regions are formed by implanting the substrate with a dopant type opposite a dopant type used to form the LDD region. This can enhance etching selectivity of the substrate. It has been observed that the disclosed methods and integrated circuit devices result in improved device performance, including but not limited to, improved control over short channel effects, increased saturation current, improved control of metallurgical gate length, increased carrier mobility, and decreased contact resistance between the source/drain and silicide features. It is understood that different embodiments may have different advantages, and that no particular advantage is necessarily required of any embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate structure over a substrate;
    performing a first implantation process with a first dopant on the substrate, thereby forming a first doped region;
    performing a second implantation process with a second dopant on the substrate, the second dopant being opposite the first dopant, thereby forming a second doped region; and
    forming a source and drain feature on at least one side of the gate structure by performing a combination of a dry etching process and a wet etching process.

2. The method of claim 1 wherein the first doped region functions as a wet etching control during the forming the source and drain feature by performing the combination of the dry etching process and the wet etching process.

3. The method of claim 1 wherein the first doped region is a source and drain region.

4. The method of claim 1 wherein the first doped region is a light doped region (LDD).

5. The method of claim 1 wherein the first doped region is interposed by the gate structure.

6. The method of claim 1 wherein the second doped region is interposed by the gate structure.

7. The method of claim 1 wherein the second doped region is spaced a distance from the gate structure.

8. The method of claim 1 wherein one of the first and the second dopants is a p-type dopant and another one of the first and the second dopants is an n-type dopant.

9. The method of claim 1 wherein the performing the second implantation process further includes:
    forming a dielectric layer over the substrate;
    performing a second implantation process utilizing the dielectric layer as a mask; and
    utilizing the dielectric layer to form spacers.

10. The method of claim 1 wherein the performing the second implantation process further includes:
    performing a tilt-angle ion implantation process; and
    forming at least one offset spacer along at least one sidewall of the gate structure.

11. The method of claim 1 wherein the forming the source and drain feature on at least one side of the gate structure further includes:
    forming a recess in the substrate that defines the source and drain feature; and
    epitaxially (epi) growing a semiconductor material to fill the recess, thereby forming the source and drain feature.

12. The method of claim 1 wherein forming source and drain feature on at least one side of the gate structure further includes etching a first and second facet in a {111} crystallographic plane of the substrate and a third facet in a {100} crystallographic plane of the substrate.

13. The method of claim 9 wherein the second doped region is spaced a distance away from the gate structure, the distance being a thickness of the dielectric layer along at least one sidewall of the gate structure.

14. The method of claim 12 wherein the etching the first, second, and third facets includes:
    etching an angle of about 45.0° to about 80.0° between the first and second facets; and
    etching an angle of about 50.0° to about 70.0° between the second and third facets.

15. A method comprising:
    forming a gate stack over a substrate;
    forming a first doped region over the substrate with a first dopant;
    etching the substrate to form a plurality of recesses interposed by the gate stack by performing a dry etching process and a wet etching process; and
    epitaxially growing a semiconductor material to fill the recesses.

16. The method of claim 15 wherein the first doped region functions as a wet etching control during the dry etching process and the wet etching process.

17. The method of claim 15 further comprising:
    forming a second doped region over the substrate with a second dopant.

18. The method of claim 15 wherein the first doped region is a lightly doped source and drain (LDD) region in the substrate.

19. The method of claim 17 wherein one of the first and the second dopants is a p-type dopant and another one of the first and the second dopants is an n-type dopant.

20. The method of claim 18 where the first doped region is interposed by the gate stack.

* * * * *